United States Patent [19]
Nielson

[11] Patent Number: 5,786,732
[45] Date of Patent: Jul. 28, 1998

[54] PHASE LOCKED LOOP CIRCUITRY INCLUDING A MULTIPLE FREQUENCY OUTPUT VOLTAGE CONTROLLED OSCILLATOR CIRCUIT

[75] Inventor: Edward T. Nielson, Vence, France

[73] Assignee: VLSI Technology, Inc., San Jose, Calif.

[21] Appl. No.: 763,479

[22] Filed: Dec. 11, 1996

Related U.S. Application Data

[63] Continuation-in-part of Ser. No. 547,418, Oct. 24, 1995, Pat. No. 5,614,868.
[51] Int. Cl.$^6$ .............. H03B 5/24; H03L 7/099; H03L 7/18; H03K 5/00
[52] U.S. Cl. .............. 331/1 A; 331/34; 331/57; 331/74; 331/177 R; 327/105; 327/116; 327/159
[58] Field of Search .............. 331/1 A, 25, 34, 331/45, 57, 60, 74, 177 R; 327/105, 116, 156–159

[56] References Cited

U.S. PATENT DOCUMENTS

| | | | |
|---|---|---|---|
| 4,893,271 | 1/1990 | Davis et al. | 364/900 |
| 5,668,504 | 9/1997 | Ramalho | 331/1 A |

OTHER PUBLICATIONS

Chie, Chak M. et al., "Phase-Locked Loops: Applications, Performance, Measures, and Summary of Analytical Results," IEEE (Not Published) 1985, pp. 3–25.

*Primary Examiner*—David Mis
*Attorney, Agent, or Firm*—Hickman & Martine, LLP

[57] ABSTRACT

A phase locked loop including a comparator, a VCO controller, and a VCO having a multi-stage oscillator portion and a combinational logic portion. The comparator is responsive to an input clock and a VCO comparison clock and is operative to produce a comparator output signal. The VCO controller is responsive to the comparator output signal and is operative to produce a VCO control signal. The multi-stage oscillator portion is configured to oscillate at a VCO clock frequency during a steady state condition under the control of the VCO control signal, and is further operative to develop a plurality of clock phases at the VCO clock frequency. The combinational logic portion is responsive to at least some of the plurality of clock phases and is operative to combine clock phases to create an output clock having an output clock frequency that is a multiple of the input clock frequency. A method for multiplying an input clock frequency includes the steps of applying an input clock to a delay chain, developing a plurality of phase-shifted clocks by tapping into the delay chain, and combining the plurality of phase-shifted clock in combinational logic to produce an output clock having a frequency that is a multiple of the input clock frequency.

32 Claims, 15 Drawing Sheets

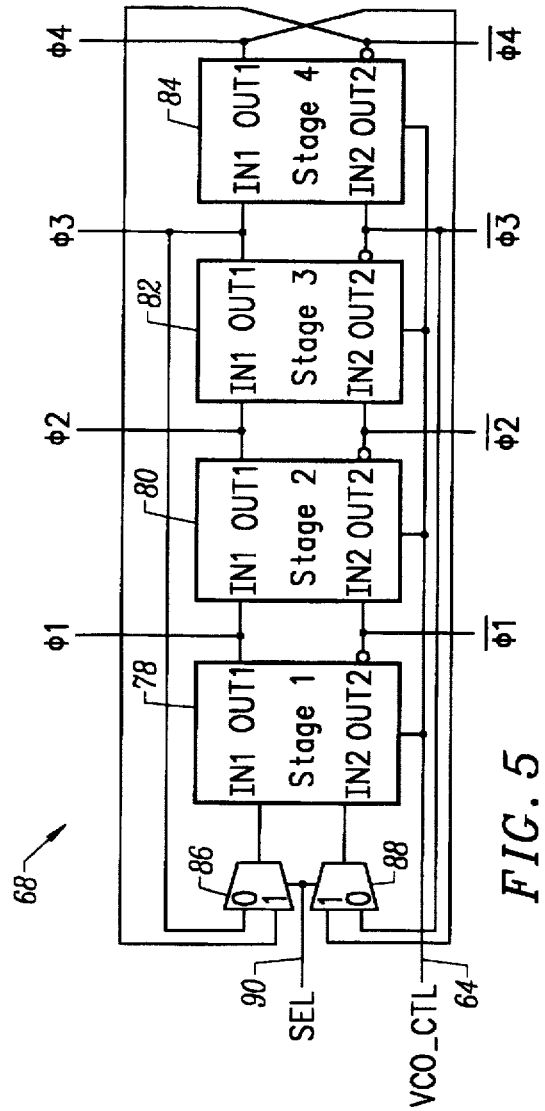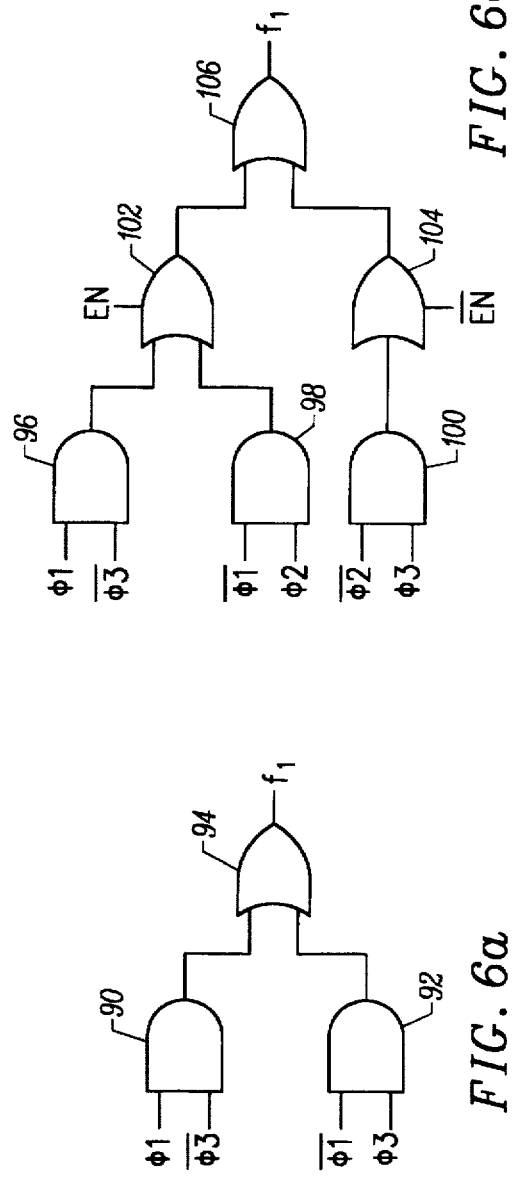
FIG. 5
FIG. 6a
FIG. 6b

PHASE LOCKED LOOP CIRCUITRY INCLUDING A MULTIPLE FREQUENCY OUTPUT VOLTAGE CONTROLLED OSCILLATOR CIRCUIT

This application is a continuation-in-part of U.S. application Ser. No. 08/547,418 filed Oct. 24, 1995, U.S. Pat. No. 5,614,868 and which is incorporated herein by reference.

TECHNICAL FIELD

This invention relates generally to phase locked loops, and more particularly to voltage controlled oscillators for phase locked loops.

BACKGROUND ART

Phase locked loops are used in electronic circuitry for a variety of purposes.

For example, phase locked loops are used for frequency multiplication, deskewing, phase alignment, and a number of other applications well known to those skilled in the art.

A phase locked loop or "PLL" 10 of the prior art is illustrated in FIG. 1. A more detailed description of phase locked loops can be found in the article "Phase-Locked Loops: Applications, Performance, Measures, And Summaries Of Analytical Results," Chak M. Chie and William C. Lindsey, *Phase-Locked Loops*, IEEE Press, 1985. The particular phase locked loop illustrated in FIG. 1 is used for frequency multiplication.

In FIG. 1, the PLL 10 includes an input signal 12 at a frequency $f_0$ which is divided by a factor "M" in a divider 14 to create an input clock 16 of frequency $f_0/M$. The input clock 16 is one input to a comparator 18. An output 20 of comparator 18 controls a loop filter 22 which produces a control signal 24. A voltage controlled oscillator or "VCO" 26 is controlled by the control signal 24 and produces an output clock $f_1$ having a frequency $f_1 = Nf_0/M$. This output clock frequency $f_1$ is, therefore, a multiple that is "N" times the input clock frequency of $f_0/M$. The output clock is divided by the factor "N" in a divider 28 to produce a comparison clock 30 having a frequency of $f_0/M$. The comparison clock 30 is compared with the input clock 16 to develop the comparator output 20.

It is apparent from the diagram of FIG. 1 that the divider 28 determines the frequency of operation of the VCO by the size of the divisor "N". Therefore, if an input clock frequency of, for example, 10 megahertz is provided, and if N=4, the output clock frequency $f_1$ and the frequency of operation of VCO 26 will be 4 times the input clock frequency, or 40 megahertz.

In FIG. 2, a prior art VCO 26 includes four latches 32, 34, 36, and 38, which are also labeled as stages 1, 2, 3, and 4, respectively. The latches 32–38 are chained together such that (except for stage 1) the inputs of each stage are coupled to the outputs of the preceding stage. The output of the last stage 4 is coupled back to the inputs of stage 1. In other words, the "chain" of stages is formed into a "loop" to provide the necessary feedback ("feedback loop") for oscillation. Since an inversion is necessary for oscillation, the outputs of stage 4 are crossed before being coupled to the inputs of stage 1. Each of the latches (stages) have an inherent delay, the length of which is controlled by a VCO control signal VCO_CTL on line 24.

A problem encountered with the prior art PLL 10 is that the VCO 26 oscillates at the high frequency level $f_1$, which is N times the input clock frequency. In the current example, if the input clock frequency is 10 megahertz, the output clock frequency $f_1$ is 40 megahertz. Since power consumption of in an electronic circuit is directly related to its frequency of operation, this high frequency operation can be quite disadvantageous in that it causes the circuit to consume a great deal of energy. This is a particular problem with battery-powered circuitry such as with portable computers.

Moreover, as operating frequencies continue to increase, e.g. into the 100 MHz, 200 MHz, and even higher frequency ranges, the frequency of operation of PLLs will become a more universal problem. This is because, in addition to increased power consumption at higher frequencies, high frequency PLL operation further suffers from other problems, including heat generation, electromagnetic interference (EMI) generation, and the difficulty of designing and manufacturing the electronic circuitry of the PLL to operate at such high frequencies.

The above-mentioned problems with prior art PLL designs are made worse when phase-shifted clocks are also required from the PLL. For example, to provide a first 50 megahertz output clock and a second 50 megahertz clock that is one quarter of a cycle (i.e. 90 degrees) out of phase with the first output clock, a conventional PLL would have to operate its VCO at 200 megahertz. The output clock could then be divided down to obtain the two clocks. Operating a VCO at 200 megahertz will cause the PLL to exhibit many of the aforementioned disadvantages, including high energy consumption, heat production, and EMI. In addition, the PLL would tend to be expensive to manufacture due to the exotic devices and manufacturing techniques that would be required to operate the PLL at such high frequencies.

DISCLOSURE OF THE INVENTION

The present invention provides an improved PLL which has a VCO which can operate at the same frequency as the input clock (or at some relatively low multiple of the input clock frequency) while providing an output clock at a multiplied frequency. The PLL and VCO of the present invention, therefore, consume less energy, generate less heat, generate less EMI, and tend to be easier and less expensive to manufacture than their counterparts in the prior art.

A phase locked loop ("PLL") in accordance with one aspect of the present invention includes a comparator, a VCO controller, and a voltage controlled oscillator (VCO). The comparator is responsive to an input clock and a VCO clock, wherein the input clock has an input clock frequency and the VCO clock has a VCO clock frequency. The comparator compares a signal derived from the input clock frequency and a signal derived from the VCO clock frequency and generates a comparator output signal in response thereto. The VCO controller is responsive to the comparator output signal and generates a VCO control signal that is supplied to the VCO.

In accordance with one embodiment of the present invention, within the VCO there is an oscillator and a decoding logic. The oscillator includes a plurality of stages, wherein an "n" number of stages are configured to oscillate at a VCO clock frequency during a steady state condition. While oscillating, each of the "n" number of stages generates one or more phase signals at the VCO clock frequency that include phase delays based on the VCO control signal. The decoding logic, within the VCO, receives the phase signals from the oscillator and uses two or more of these phase signals to generate at least one corresponding clock signal at a second frequency that is "y" times (i.e., a multiple of) the VCO clock frequency, and wherein "n", i.e. the number of oscillating stages, divided by "y" is to equal to a positive integer.

A voltage controlled oscillator, in accordance with yet another embodiment of the present invention includes a multi-stage oscillator portion configured to oscillate at a VCO clock frequency under steady-state conditions and to develop a plurality of clock phases at the VCO clock frequency, and a combinational logic portion responsive to at least some of the plurality of clock phases and operative to combine at least some of the clock phases to create an output clock having an output clock frequency that is a multiple of the VCO clock frequency. Preferably, the oscillator portion includes a plurality or "chain" of latches, where an input of each latch except a first latch is coupled to an output of a preceding latch. An input of the first latch is coupled to an output of the last latch to provide the necessary feedback loop for oscillation. Each of the latches provides a delay having a period controlled by the VCO control signal. The plurality of clock phases are taken from the outputs of the latches. In addition to latch based stages, other types of digital and/or analog based delay chains can also be used, such as, for example a series of invertors, or a series of differential amplifiers.

In accordance with another embodiment of the present invention, there is provided a method for generating one or more clock signals. The method includes providing a plurality of stages, wherein "n" number of the plurality of stages are coupled together to form a delay chain, configuring the delay chain to oscillate at a first frequency during a steady state condition, applying a control signal to the delay chain, the control signal establishing a delay time in each of the plurality of stages within the delay chain, generating a plurality of phase signals at the first frequency with the delay chain in response to a control signal, and decoding at least two of the plurality of phase signals and generating at least one clock signal at a second frequency that is a "y" multiple of the first frequency, wherein "n" divided by "y" is equal to a positive integer.

An advantage of the present invention is that frequency multiplication can be accomplished without operating a voltage controlled oscillator of a phase locked loop at the output frequency. In addition, multiple phases of a desired output frequency can be obtained from the multiple clock phases provided by the VCO of the present invention. Furthermore, with several embodiments of the present invention a plurality of output clock signals can be produced at the same time, phase-shifted output clock signals can be produced, and clock signals having non-uniform duty cycles can be produced.

These and other advantages of the present invention will become apparent upon reading the following detailed descriptions and studying the various figures of the drawings.

BRIEF DESCRIPTION OF THE DRAWINGS

FIG. 5 is a schematic of a multi-stage (four-stage) oscillator portion of a VCO in accordance with one embodiment of the present invention;

FIGS. 6a and 6b are two examples of the combinational logic portion of a VCO, in accordance with one embodiment of the present invention, that can be used with the multi-stage (four-stage) oscillator portion of FIG. 5;

BEST MODES FOR CARRYING OUT THE INVENTION

Figure 1:
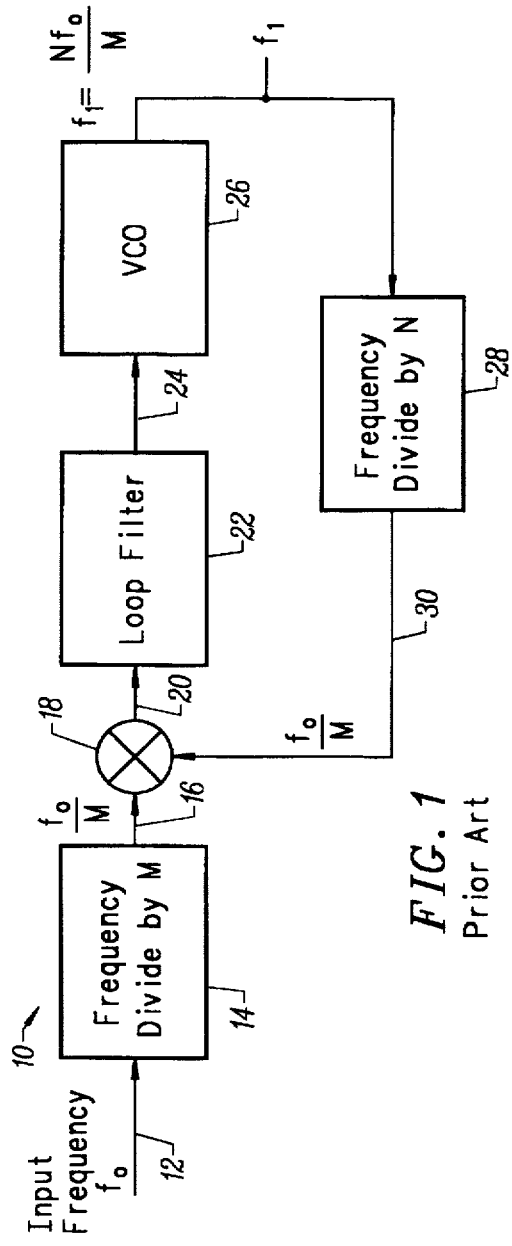
FIG. 1 is a block diagram of a phase locked loop ("PLL") of the prior art.
Figure 2:
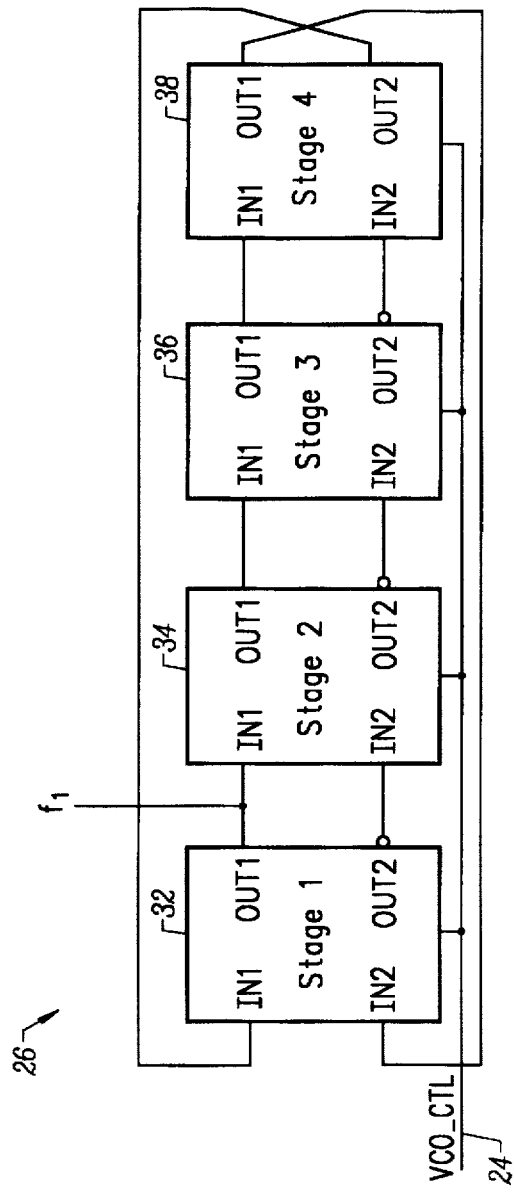
FIG. 2 is a schematic of a voltage controlled oscillator ("VCO") of the prior art.
Figure 3:
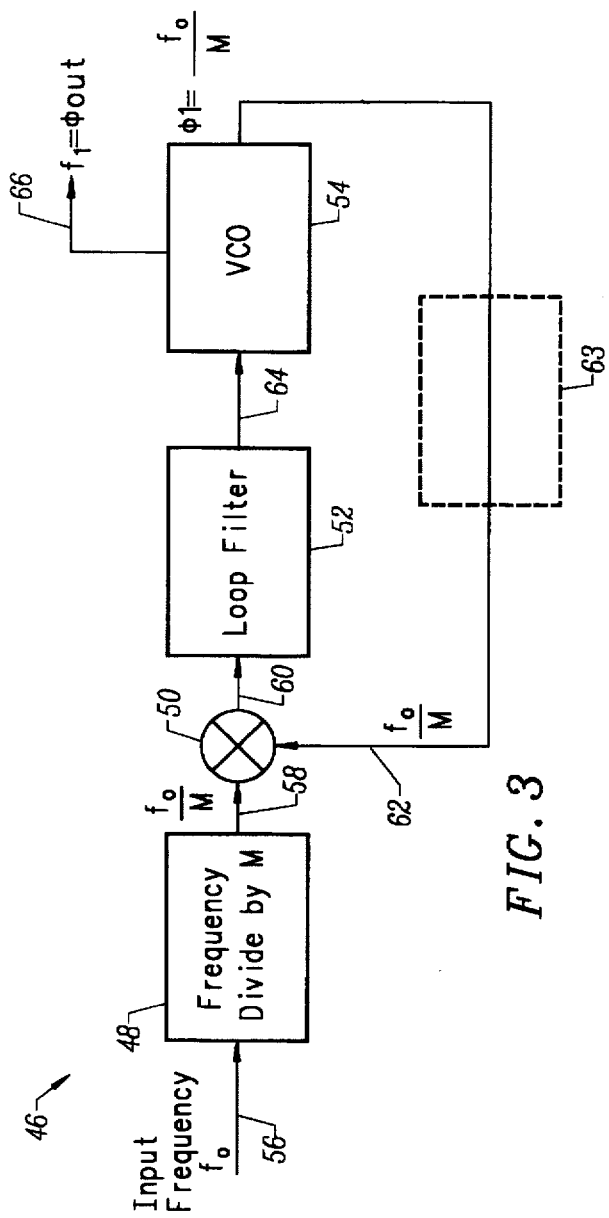
FIG. 3 is a block diagram of a PLL of the present invention.

FIGS. 1 and 2 were discussed with respect to the prior art. In FIG. 3, a phase locked loop or "PLL" 46 in accordance with the present invention includes a frequency divider 48, a comparator 50, a loop filter 52, and a voltage controlled oscillator or "VCO" 54. An input signal of frequency $f_0$ is input on a line 56 into frequency divider 48 to provide an input clock of a frequency $f_0/M$ on a line 58. The input signal of frequency $f_0$ is typically provided by a crystal oscillator and is typically divided by "M" to provide a suitable input clock frequency for multiplication by "N" in the VCO 54. In many instances, N=1, eliminating the need for a feedback divider. However, by dividing by M and multiplying by N, a great number of output clock frequencies can be generated from a given crystal oscillator. The design and use of crystal oscillators and the design and use of frequency dividers such as frequency divider 48 are well known to those skilled in the art.

A comparator 50 has, as a first input, the input clock on line 58 and has, as an output, a comparator output signal on a line 60. As will be discussed in greater detail subsequently, the comparator 50 also has a second input of a VCO comparison clock that is developed by VCO 54 on a line 62.

The design and use of comparators such as comparator 50 are well known to those skilled in the art. Simply stated, the comparator 50 compares the frequency of the input clock on line 58 to the VCO comparison clock on line 62. If the input clock frequency, for example, is greater than the VCO comparison clock frequency, a first type of signal is provided on line 60. If the input clock frequency is less than the VCO comparison clock frequency, a second type of signal will be provided on line 60. In other words, the comparator output signal reflects the relative frequencies of the input clock and the VCO comparison clock.

As will be discussed subsequently, the comparator output ultimately causes an adjustment in the frequency of oscillation of the VCO 54 so that, during a steady-state operation of the PLL 46, the frequency of oscillation of the VCO 54 is essentially the same frequency as the frequency of the input clock 58 when N=1. By "essentially" or "about", it meant that within practical tolerances, the frequencies are as specified. However, since in the real world there are always factors such as skew, thermal and electrical fluctuations, etc. to contend with, the frequencies may not be exactly as specified at any particular instant in time. However, they will be very close to being as specified. Since the VCO 54 is oscillating at about the same frequency as the input clock when N=1, it will be apparent that the VCO 54 will exhibit the numerous advantages of low frequency operation discussed previously.

The design and use of loop filters such as loop filter 52 are also well-known to those skilled in the art. The comparator output signal is input into loop filter 52 and, as discussed below, the loop filter 52 ("VCO controller") produces a VCO control signal on a line 64 which effects the frequency of oscillation of the VCO circuit.

The operation of the comparator 50 and loop filter 52 will, therefore, be explained herein through the use of simplified terms since their operation is well known to those skilled in the art. The comparator 50 can be thought of as developing a "digital" signal indicating either a "charge" or "discharge" of the loop filter should be accomplished. This "digital" signal can be thought of as corresponding to the first and second types of signals described earlier. If, for example, the VCO 54 is oscillating too slowly, the comparator will create a first type of signal ("charge") to cause a current source of the loop filter 52 to "charge up" and appropriately adjust the voltage of the VCO control signal on line 64. If the VCO 54 is oscillating too fast, the comparator will create a second type of signal ("discharge") which will discharge loop filter, again appropriately adjusting the voltage of the VCO control signal on line 64. Therefore, the PLL includes a feedback loop which causes the VCO 54 to oscillate at the appropriate frequency during steady-state conditions.

The VCO 54 produces the VCO comparison clock on a line 62 and also includes an output clock $f_1$ on a line 66. This output clock $f_1$ will be alternatively referred to as $\phi_{OUT}$. The VCO clock on line 62 will also be referred to as $\phi 1$ which, as noted, is the same as the input clock frequency, i.e. $f_0/M$. It should be noted that since the VCO 54 can operate at the input clock frequency, the frequency divider (such as frequency divider 28 of FIG. 1) that was required in the prior art is not required for the present invention.

Nonetheless, it should be also noted that an optional frequency divider ("feedback divider") 63 can be provided in the present invention. In that instance, the output of the VCO is coupled to an input of the frequency divider 63, and the output of the frequency divider 63 is coupled to line 62, i.e. to an input of the comparator 50. While it is not necessary to run the VCO 54 at a frequency higher than the input clock 58, it may be desirable to do so to obtain a desired VCO output clock frequency. For example, odd frequency multiples such as 1.75, 2.25, 1.67, etc. can be obtained for the VCO output clock by choosing proper values for M (of divider 48) and N (of divider 63) for a given input frequency from a crystal or other type of input frequency oscillator.

Figure 4:
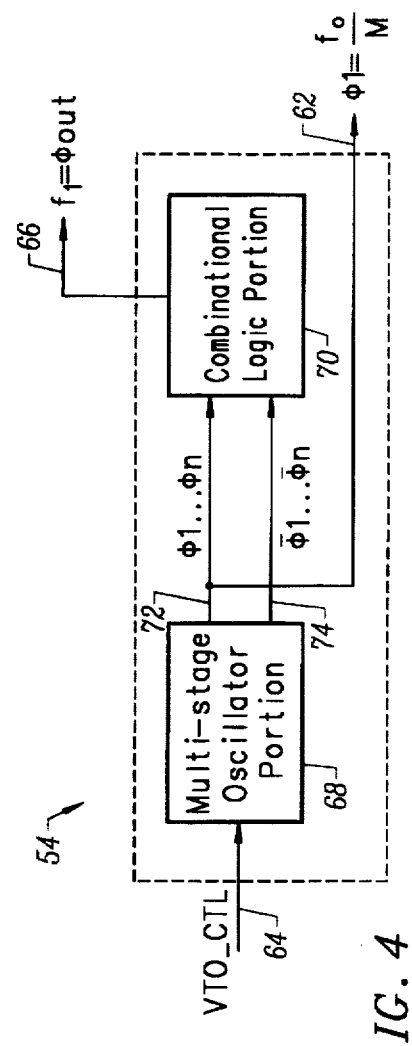
FIG. 4 is a block diagram of a VCO of the present invention.

In FIG. 4, the VCO 54 of the present invention is illustrated in greater detail. More particularly, the VCO 54 includes a multi-stage oscillator portion 68 and a combinational logic portion 70. The multi-stage oscillator portion includes many of the same elements of a latch-type VCO 26 of the prior art. However, unlike the prior art, which often has a single output from the VCO, the oscillator portion 68 of the present invention produces a number of phases $\phi 1$, $\phi 2$, $\phi 3$ ... $\phi n$ on an output bus 72 and the complements (also known as "inverses" or "inversions") of these clock phases on a bus 74. In the present description, the complement or inversion of a signal will be indicated by an "*" in the specification and claims, but will be shown in the figures with an "inversion bar" ( a horizontal line drawn over the particular signal to indicate its inversion). For example, the complement of the clock phase $\phi 1$ will be designated in the specification and claims as $\phi 1^*$, and will be shown in the drawings with the well-known inversion bar.

The VCO clock on line 62 is simply $\phi 1$ from the multi-stage oscillator portion 68. However, the output clock $f_1$ (also known as $\phi_{OUT}$) is produced by the combinational logic portion 70 from one or more phases of the phase clocks on buses 72 and 74. Both the multi-stage oscillator portion 68 and the combinational clock 70 will be discussed in greater detail with reference to subsequent figures.

In FIG. 5, a multi-stage oscillator portion 68 in accordance with the present invention includes four latches 78, 80, 82, and 84, which are also referred to herein as stages 1, 2, 3, and 4, respectively. Each of the stages has a pair of inputs IN1 and IN2, and a pair of outputs OUT1 and OUT2. For a given stage, OUT1 is the inverse of IN1, OUT2 is the inverse of IN2, and OUT2 is the complement of OUT1 as indicated by the open "bubble" on the OUT2 outputs. This is in accordance with standard latch-type VCO design. Each of the latches 78–84 also include a control input coupled to the VCO control signal VCO_CTL on line 64. As it is well-known to those skilled in the art, the delay of each of the stages 78–84 will decrease as the voltage level on line 64 increases and will increase as the voltage level on line 64 decreases.

With the exception of stage 1, the inputs of each stage are coupled to the outputs of the preceding stage. In other words, input IN1 of each stage is coupled to output OUT1 of the preceding stage, and input IN2 of each stage is coupled to the output OUT2 of the preceding stage. An inversion is performed at each stage, as was explained previously.

The oscillator portion 68 further includes a first multiplexer 86 and a second multiplexer 88 having their respective outputs coupled to the input IN1 of stage 1 and to the input IN2 of stage 1. The multiplexers are controlled by a common control signal SEL on a line 90 to allow the oscillator portion 68 to operate as a three-stage or as a four-stage oscillator. When the signal SEL on line 90 is high ("1") output OUT2 of stage 4 is coupled to input IN1 of stage 1 and output OUT1 of stage 4 is coupled to input IN2 of stage 1. When the value of SEL is low ("0") the output OUT1 of stage three is coupled to the input IN1 of stage 1, and the output OUT2 of stage 3 is coupled to the input IN2 of stage 1.

It should be noted that when the oscillator portion 68 is operated with three stages, the outputs of stage 3 are fed directly into corresponding inputs of stage 1. However, if four stages are to be used, the outputs of stage 4 are crossed before they are coupled into the inputs of stage 1. This is because, for proper oscillation, an inversion of the signal in the last stage must be applied to the inputs of the first stage. Since each stage has its own inherit inversion, if an odd number of stages are used the inversion happens automatically. However, if an even number of stages are used, the outputs need to be inverted (either with inverters or by it being crossed as shown) before being applied back to the input of stage 1.

It should also be noted that each of the outputs of each of the stages has a "tap" to provide a plurality of clock phases. In other words, the oscillator portion 68 is an example of a multi-stage delay chain with multiple taps to provide multiple clock phases, i.e. one instance of a circuit for developing a plurality of phase-shifted clocks by tapping into a chain of delay elements. The output OUT1 of stage 1 is labeled as $\phi 1$, the output OUT1 of stage 2 is labeled as $\phi 2$, the output OUT1 of stage 3 is labeled as $\phi 3$, and the output OUT1 of stage 4 is labeled as $\phi 4$. The complements $\phi 1^*$–$\phi 4^*$, of clock phases $\phi 1$–$\phi 4$ are taken from the outputs OUT2 of the corresponding stages, as shown in the figure.

FIGS. 6a and 6b illustrate two examples of combinational logic utilizing the phase clocks on buses 72 and/or 74 to provide an output frequency $f_1$ that is a multiple of the input frequency. As it is well-known to those skilled in the art, "combinational" (or "combinatorial") logic refers to the combination of unclocked logic gates such as AND, OR, NAND, NOR, XOR, or their logical equivalents. Therefore, the signals propagating through combinational logic are not strictly in phase with the input clock. However, if the combinational logic is fast and not too complicated, the delay or "skew" of the combinational logic will be negligible and can be safely ignored in most instances.

In FIG. 6a, combinational logic including two AND gates 90 and 92 and an OR gate is shown. The AND gate 90 has inputs coupled to the clock phases $\phi 1$ and $\phi 3^*$, and AND gate 92 has inputs coupled to the clock phases $\phi 1^*$ and $\phi 3$. The outputs of AND gates 90 and 92 are the inputs to OR gate 94, and the output of OR gate 94 is the output clock $f_1$. The combinational logic of FIG. 6a will be operative to produce an output frequency $f_1$ which is twice the input frequency of the input clock to the PLL 46 when the signal SEL on line 90 is high, i.e. when the oscillation portion 68 is in a four-stage mode.

FIG. 6b is another example of combinational logic which can be used when the signal SEL on line 90 of FIG. 5 is low, i.e. when the oscillator portion 68 is operating in a three-stage mode. The combinational logic of FIG. 6b includes three AND gates 96, 98, and 100 and three OR gates 102, 104, and 106. The OR gates 102 and 104 are enabled by the signals EN and EN*, respectively. More particularly, the inputs of AND gate 96 are $\phi 1$ and $\phi 3^*$. The inputs of AND gate 98 are $\phi 1^*$ and $\phi 2$, the inputs of AND gate 100 are $\phi 2^*$ and $\phi 3$, the inputs to OR gate 102 are the outputs of AND gates 96 and 98, the input of OR gate 104 is the output of AND gate 100, and the inputs of OR gate 106 are the outputs of OR gates 102 and 104. The output of OR gate 106 is the output clock $f_1$.

In operation, the combinational logic of FIG. 6b will produce an output frequency of 1.5 times the input clock. This is accomplished "masking" alternate half cycles with the EN and EN* signals derived from a toggle device connected to other phases. In the present example, EN is provided by the output of a "toggle" flip-flop with $\phi 1$ as its input, and EN* is provided by the output of a toggle flip-flop with $\phi 3^*$ as an input.

As will be apparent from the foregoing examples, there are great many of combinational logic configurations that can be used to provide different output frequencies. These output frequencies $f_1$ can be integer multiples of the input clock or can be non-integer multiples of the input clock. By combining or expanding combinational logic, multiple output frequencies and/or phases can be provided.

The components and interconnections of the combinational logic used to produce a particular output clock tend to fall into certain patterns. For example, with an n-stage oscillator portion 68, it is possible to get a multiplication by N (i.e. the output clock frequency $f_1$ is N times the input clock frequency $f_0/M$), as long as n is an even number, by producing combinational logic having the following properties:

$$\phi_{OUT} = \sum_{i=1}^{n/2} [(\phi_{2i-1} \times \phi_{2i}) + (\phi^*_{2i-1} \times \phi^*_{2i})] \quad \text{(Equation 1A)}$$

Here, of course, the "x" is an AND operation and the "+" is an OR operation. To create the combinational logic, the AND operation can be implemented with an AND gate, and the OR operation can be implemented with an OR gate, or logical equivalents thereof.

As a further example, with an n-stage oscillator portion 68, it is possible to get a multiplication by N (i.e. the output clock frequency $f_1$ is N times the input clock frequency $f_0/M$), as long as n is an odd number, by producing combinational logic having the following properties:

$$\phi_{OUT} = (\phi_1 \times \phi_n) + \sum_{i=1}^{n-1} (\phi_i \times \phi_{i+1}) \quad \text{(Equation 1B)}$$

It should also be noted at this point that there is a synergistic combination between the multi-stage oscillator portion 68 and the combinational logic portion 70. In order to produce the desired 50% duty cycle for the output clock, the oscillator portion 68 is required. Then, by proper combination of the various phases produced by the oscillator portion 68, the combinational logic portion 70 can provide an output clock having a 50% duty cycle (i.e. it is "high" and "low" for the same amount of time in each cycle) at a number of desirable multiples and/or phases of the input clock frequency.

Figure 7A:
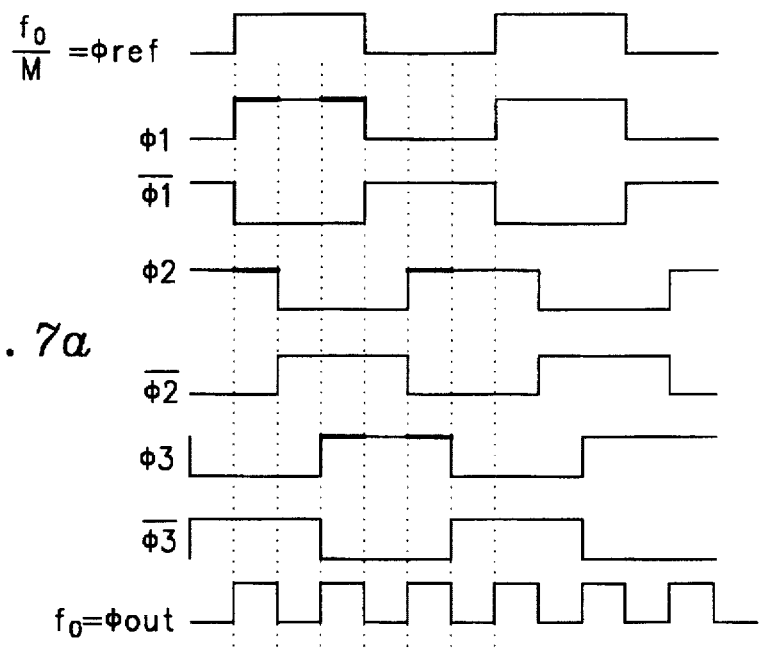
FIG. 7a and 7b are timing diagrams illustrating the operation of a phase locked loop of the embodiments of the present invention as shown in FIGS. 5 and 6a–b.

In FIG. 7a, a timing diagram is shown for a 3-stage oscillator portion 68 which can provide an output $f_1$ that is three times the frequency of the input clock. It should be noted that since there are an odd number of stages in this oscillator portion, the formula of Equation 1B should be used. In this instance, the following combinational logic in implemented by substituting n=3 into Equation 1B:

$$\phi OUT = (\phi 1 \times \phi 3) + (\phi 1 \times \phi 2) + (\phi 2 \times \phi 3) \quad \text{(Equation 2)}$$

The portions of the signals being "ANDED" together are highlighted with darkened lines in the timing diagram of FIG. 7a. As noted, $\phi 1$ is ANDED with $\phi 2$, $\phi 1$ is ANDED with $\phi 3$, and $\phi 2$ is ANDED with $\phi 3$. The "ORING" of these AND operations results in the output clock $f_1$.

Figure 7B:
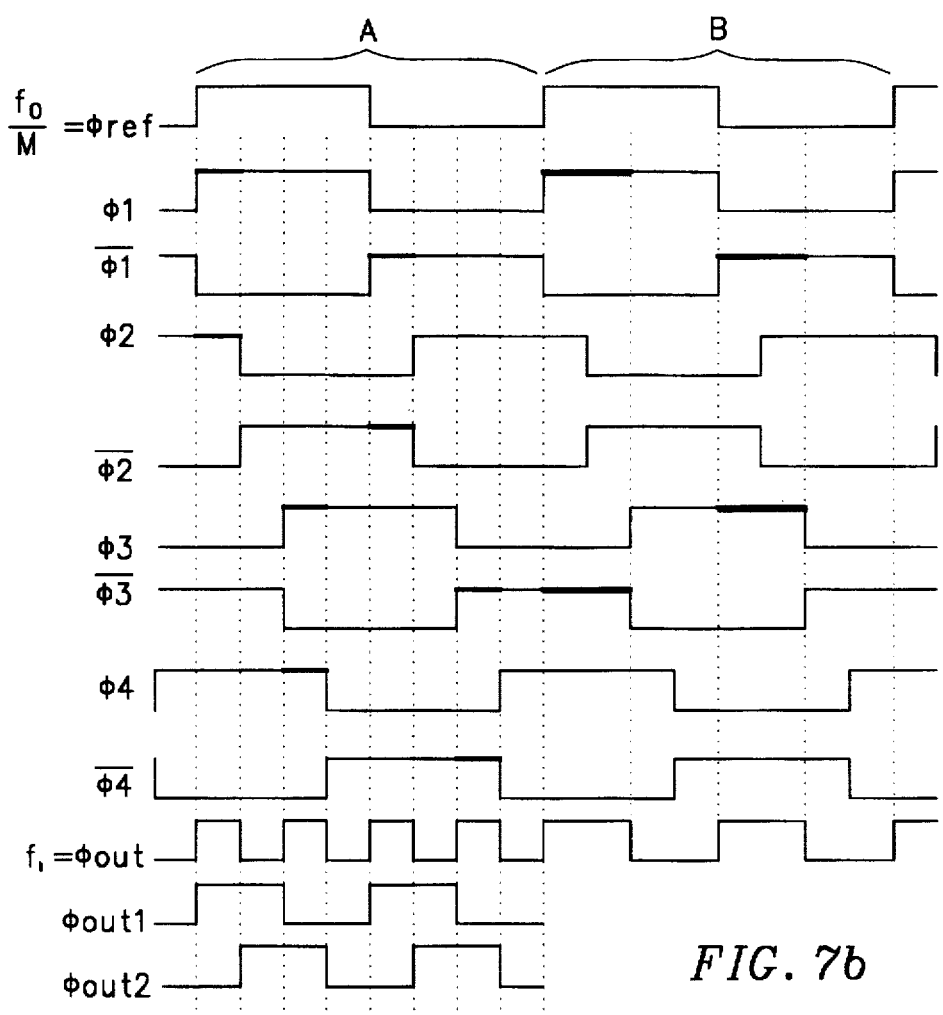

FIG. 7b is used to illustrate several types of combinational logic for a 4-stage oscillation portion 68. More particularly, section A of FIG. 7b illustrates a four times multiplication, while section B illustrates a two times multiplication of the output clock $f_1$. It should also be noted that a one times multiplication can be provided by directly taking $\phi 1$ as the output clock $f_1$. In other words, if $\phi 1$ is used as the output clock, no combinational logic or a "null" combinational logic can be used to produce the output clock at a frequency $f_1 = \phi 1$.

To get multiplication by 2 (in the B portion of FIG. 7b) the following combinational logic is implemented:

$$\phi OUT=(\phi1\times\phi3^*)+(\phi1^*\times\phi3) \quad \text{(Equation 3)}$$

The darkened portions of the various wave forms are shown to illustrate the portions of those wave forms that are ANDED together to create the output wave form of the output clock at frequency $f_1$.

To produce a four times multiplication (in the A portion of FIG. 7b) the following combinational logic is implemented:

$$\phi OUT=(\phi1\times\phi3^*)+(\phi1^*\times\phi3) \quad \text{(Equation 4)}$$

It should be noted that this combinational logic is an instance of the general formula of Equation 1A for an n-stage oscillator portion 68, where n is an even number and where a multiplication by N is required. Again, the portions of the signals that are being ANDED are shown with darkened lines to help illustrate this concept.

It should also be noted that various phases of a VCO output clock can be provided. For example, and with reference to the timing diagram of FIG. 7b for a four-stage VCO implementation, it is a straightforward task to obtain both a $\phi OUT1 = \phi REF\times2$ and a $\phi OUT2=(\phi REF\times2)+90°$ can be obtained by appropriate combinational logic as follows:

$$\phi OUT1=(\phi1\times\phi3^*)+(\phi1^*\times\phi3) \quad \text{(Equation 5)}$$

$$\phi OUT2=\phi OUT1+90°=(\phi2\times\phi4^*)+(\phi2^*\times\phi4) \quad \text{(Equation 6)}$$

The preceding examples therefore illustrate that both multiple clocks at multiple frequencies and multiple clocks at multiple clock phases can be produced with the present invention by providing appropriate combinational logic.

It should be further noted that there are number of ways of implementing the functionality of the divider 48, comparator 40, and loop filter 52 of FIG. 3 that are well-known to those skilled in the art. These alternate designs are considered equivalents within the scope of the present invention. Furthermore, there are several well-known designs for VCO oscillators which can serve as a multi-stage oscillator portion 68. These, too, are considered to be equivalents within the scope of the present invention as long as they are capable of producing appropriate clock phases for the combinational logic portion 70 of the present invention. A designer of ordinary skill in the art will be able to design combinational logic to produce appropriate output clock frequencies and phases for desired applications given the foregoing instructions. It should also be noted that those skilled in the art know that the functionality of combinations of discrete logic gates (such as AND, OR, etc. gates) can be implemented in functionally logical equivalents in integrated circuits without the use of such discrete logic gates.

It is further recognized that for some embodiments of the present invention there exists a possibility that the PLL can momentarily lose lock when switching between stages. For example, consider a PLL having the four-stage oscillator portion as shown in FIG. 5. As discussed above, such a four-stage oscillator portion can be configured as either a three-stage or a four-stage oscillator based on the signal SEL on line 90. However, when switched from a three-stage to a four-stage, or from a four-stage to a three-stage, the PLL tends to lose lock due to the change in the operating speed of the oscillator portion. The PLL will lose lock because this sudden change in operating speed will not be instantaneously reflected in the VCO_CTL signal that is supplied to each of the stages. However, following a brief delay the PLL will re-lock and the VCO_CTL will have been adjusted for the reconfigured oscillator portion.

In other words, the operating speed of a three-stage configuration will be faster than a four-stage configuration, for a given VCO_CTL signal (voltage) due to missing delay time presented by the fourth stage. Thus, while the voltage of the VCO_CTL signal is changing the PLL is out of lock and the output clock is essentially uncontrolled for a brief period, i.e., it is running at a different frequency than intended.

To remedy the problem of the PLL becoming momentarily unlocked the number of stages within the multi-stage oscillator portion can be set to a number that allows the desired output frequencies to be generated without having to reconfigure the multi-stage oscillator portion via a signal SEL (i.e., essentially "matching" the oscillator to the desired output frequencies). Preferably, a selected number of stages will be an integral multiple of each of the desired output frequencies. For example, notice that in the four-stage oscillator portion discussed above, when configured as a four-stage oscillator portion via signal SEL the output phases can be combined within the combinational logic to produce an output frequency of 1, 2, or 4 times the input clock without the PLL having to be reconfigured or losing lock. Notice that 4 is an integral multiple of 1, 2 and 4. By increasing the number of stages additional output frequencies are possible. For example, if the desired output frequencies in 1, 2, 3 and 4 times the input clock, then a twelve-stage oscillator portion would be required (i.e., 12 being an integral multiple of by 1, 2, 3, and 4). As will be discussed below, such a twelve-stage oscillator portion would also allow for output frequencies that are 6 and 12 times the input frequency. Moreover, in some embodiments a plurality of these outputs can be made available simultaneously.

Figure 8:
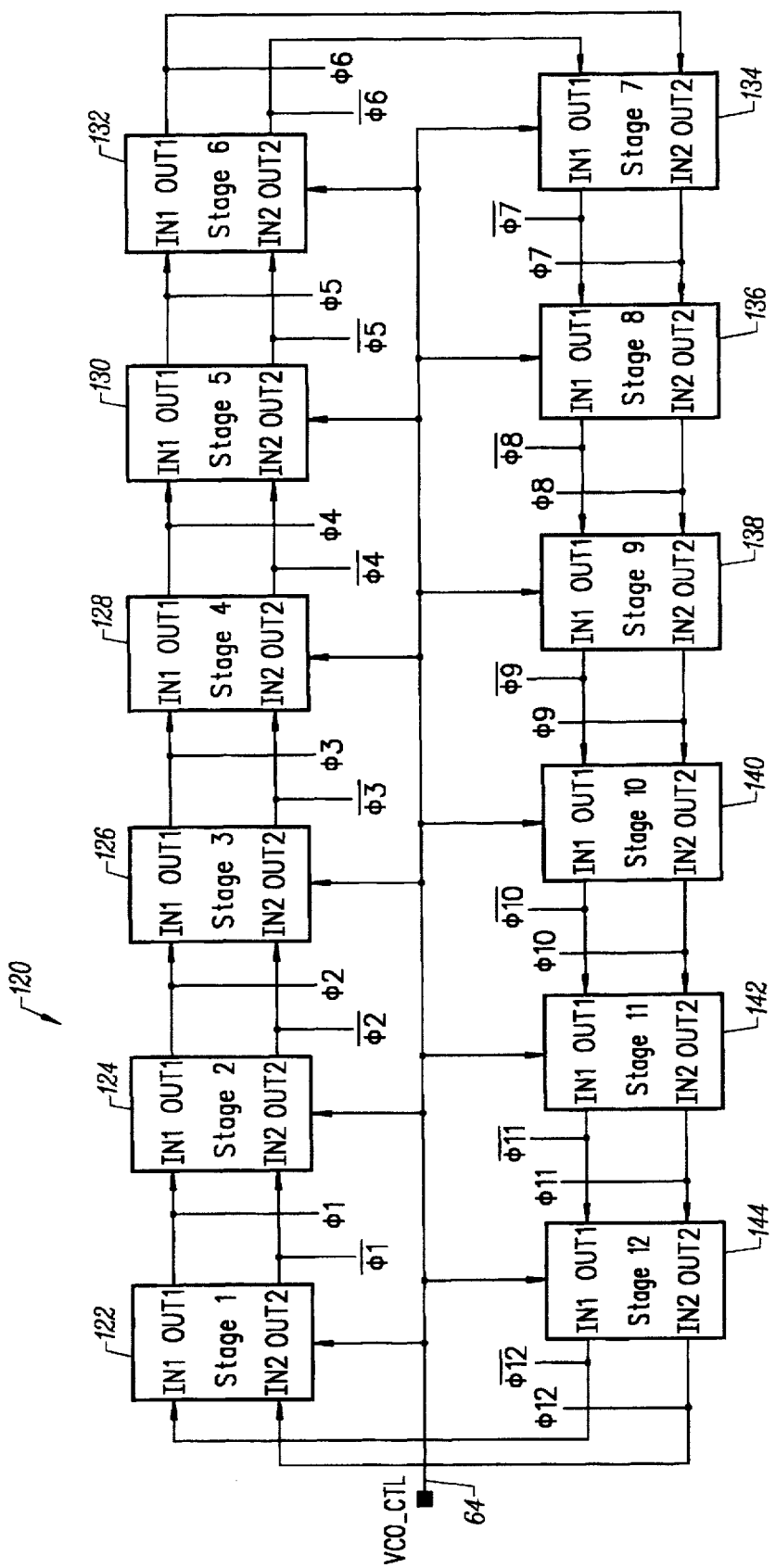
FIG. 8 is a schematic of a multi-stage (twelve-stage) oscillator portion of a VCO in accordance with an embodiment of the present invention.

FIG. 8 is a schematic of a multi-stage (12-stage) oscillator portion of a VCO in accordance with an embodiment of the present invention. In FIG. 8, multi-stage oscillator portion 120 includes twelve latches 122, 124, 126, 128, 130, 132, 134, 136, 138, 140, 142, and 144, which are also referred to herein as stages 1-12, respectively. Each of the stages has a pair of inputs IN1 and IN2, and a pair of outputs OUT1 and OUT2. For a given stage, OUT1 is the inverse of IN1, OUT2 is the inverse of IN2, and OUT2 is the complement of OUT1 as indicated by the open "bubble" on the OUT2 outputs. This is in accordance with standard latch-type VCO design. Each of the latches 122-144 also include a control input coupled to the VCO control signal VCO_CTL on line 64. As mentioned above, it is well-known to those skilled in the art, the delay of each of the stages 122-144 will decrease as the voltage level on line 64 increases and will increase as the voltage level on line 64 decreases.

As with the multi-stage oscillator in FIG. 5 above, with the exception of stage 1, the inputs of each stage are coupled to the outputs of the preceding stage. In other words, input IN1 of each stage is coupled to output OUT1 of the preceding stage, and input IN2 of each stage is coupled to the output OUT2 of the preceding stage. Stage 1 receives is coupled to the outputs of Stage 12. Notice, that an inversion is performed at each stage, as explained previously.

Furthermore, as in FIG. 5, each of the outputs of each of the stages has a "tap" to provide a plurality of clock phases. The output OUT1 of each one of stages 1-12 are labeled as clock phases $\phi1-\phi12$, respectively, and the complements $\phi1^*-\phi12^*$, of clock phases $\phi1-\phi12$ are taken from the outputs OUT2 of the corresponding stages, as shown in the figure.

FIGS. 9a-9e illustrates five implementations of the combinational logic portion of a VCO, in accordance with an embodiment of the present invention. The combinational logic portions in FIGS. 9a–e can be used with the twelve-stage oscillator portion of FIG. 8 to produce output frequencies that are 2, 3, 4, 6 and 12 times the input frequency.

Figure 9A:
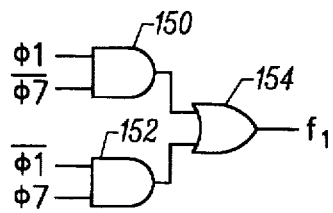
FIGS. 9a–9e are five examples of the combinational logic portion of a VCO, in accordance with an embodiment of the present invention, that can be used with the multi-stage (twelve-stage) oscillator portion of FIG. 8.

The combinational logic of FIG. 9a includes two AND gates 150 and 152 and an OR gate 154. The inputs of AND gate 150 are $\phi1$ and $\phi7^*$, the inputs of AND gate 152 are $\phi1^*$ and $\phi7$, the inputs to OR gate 154 are the outputs of AND gates 150 and 152. The output of OR gate 154 is the output clock $f_1$. With the combinational logic of FIG. 9a output clock $f_1$ is 2 times the input frequency. Those skilled in the art will recognize that other combinational logic may be implemented to accomplish the following function as embodied in FIG. 9a:

$$\phi OUT = (\phi1 \times \phi7^*) + (\phi1^* \times \phi7) \quad \text{(Equation 7)}$$

Figure 9B:
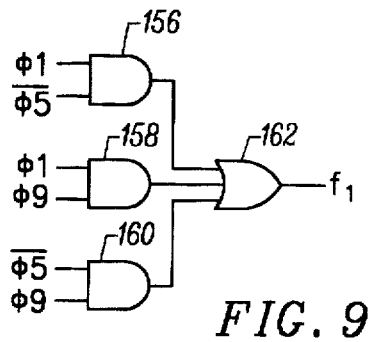

The combinational logic of FIG. 9b includes three AND gates 156, 158 and 160 and an OR gate 162. The inputs of AND gate 156 are $\phi1$ and $\phi5^*$, the inputs of AND gate 158 are $\phi1$ and $\phi9$, the inputs of AND gate 160 are $\phi5^*$ and $\phi9$, the inputs to OR gate 162 are the outputs of AND gates 156, 158 and 160. The output of OR gate 162 is the output clock $f_1$. With the combinational logic of FIG. 9b output clock $f_1$ is 3 times the input frequency. Those skilled in the art will recognize that other combinational logic may be implemented to accomplish the following function as embodied in FIG. 9b:

$$\phi OUT = (\phi1 \times \phi5^*) + (\phi1^* \times \phi9) + (\phi5^* \times \phi9) \quad \text{(Equation 8)}$$

Figure 9C:
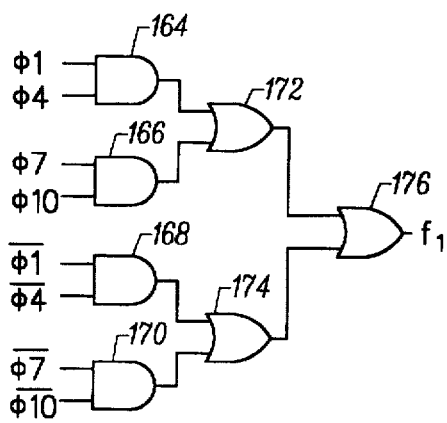

The combinational logic of FIG. 9c includes four AND gates 164, 166, 168, and 170, and three OR gates 172, 174, and 176. The inputs of AND gate 164 are $\phi1$ and $\phi4$, the inputs of AND gate 166 are $\phi7$ and $\phi10$, the inputs of AND gate 168 are $\phi1^*$ and $\phi4^*$, the inputs of AND gate 170 are $\phi7^*$ and $\phi10^*$, the inputs to OR gate 172 are the outputs of AND gates 164 and 166, the inputs to OR gate 174 are the outputs of AND gates 168 and 170, and the inputs to OR gate 176 are the outputs of OR gates 172 and 174. The output of OR gate 176 is the output clock $f_1$. With the combinational logic of FIG. 9c output clock $f_1$ is 4 times the input frequency. Those skilled in the art will recognize that other combinational logic may be implemented to accomplish the following function as embodied in FIG. 9c:

$$\phi OUT = (\phi1 \times \phi4) + (\phi7 \times \phi10) + (\phi1^* \times \phi4^*) + (\phi7^* \times \phi10^*) \quad \text{(Equation 9)}$$

Figure 9D:
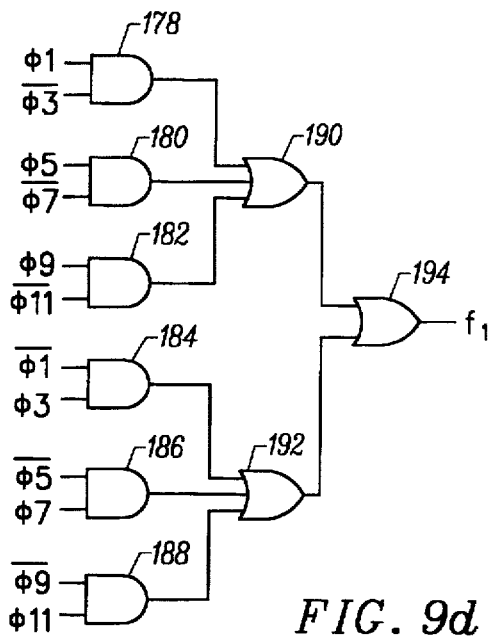

The combinational logic of FIG. 9d includes six AND gates 178, 180, 182, 184, 186, and 188, and three OR gates 190, 192, and 194. The inputs of AND gate 178 are $\phi1$ and $\phi3^*$, the inputs of AND gate 180 are $\phi5$ and $\phi7^*$, the inputs of AND gate 182 are $\phi9$ and $\phi11^*$, the inputs of AND gate 184 are $\phi1^*$ and $\phi3$, the inputs of AND gate 186 are $\phi5^*$ and $\phi7$, the inputs of AND gate 188 are $\phi9^*$ and $\phi11$, the inputs to OR gate 190 are the outputs of AND gates 178, 180 and 182, the inputs to OR gate 192 are the outputs of AND gates 184, 186 and 188, and the inputs to OR gate 194 are the outputs of OR gates 190 and 192. The output of OR gate 194 is the output clock $f_1$. With the combinational logic of FIG. 9d output clock $f_1$ is 6 times the input frequency. Those skilled in the art will recognize that other combinational logic may be implemented to accomplish the following function as embodied in FIG. 9d:

$$\phi OUT = (\phi1 \times \phi3^*) + (\phi5 \times \phi7^*) + (\phi9 \times \phi11^*) + (\phi1^* \times \phi3) + (\phi5^* \times \phi7) + (\phi9^* \times \phi11) \quad \text{(Equation 10)}$$

Figure 9E:
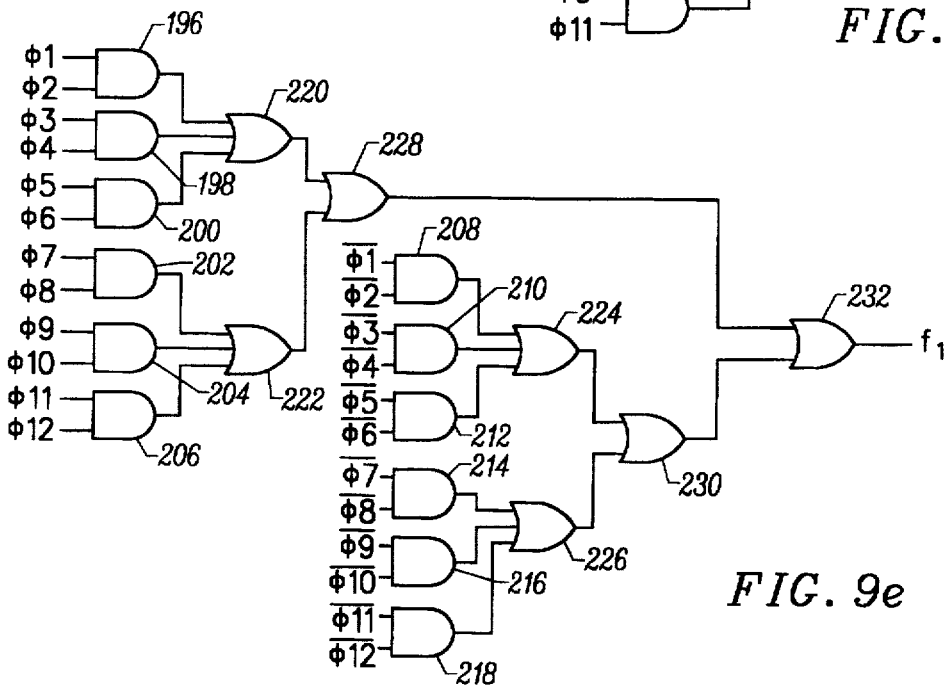

The combinational logic of FIG. 9e includes twelve AND gates 196, 198, 200, 202, 204, 206, 208, 210, 212, 214, 216, and 218, and seven OR gates 220, 222, 224, 226, 228, 230, and 232. The inputs of AND gate 196 are $\phi1$ and $\phi2$, the inputs of AND gate 198 are $\phi3$ and $\phi4$, the inputs of AND gate 200 are $\phi5$ and $\phi6$, the inputs of AND gate 202 are $\phi7$ and $\phi8$, the inputs of AND gate 204 are $\phi9$ and $\phi10$, and the inputs of AND gate 206 are $\phi11$ and $\phi12$. Similarly, the inputs of AND gate 208 are $\phi1^*$ and $\phi2^*$, the inputs of AND gate 210 are $\phi3^*$ and $\phi4^*$, the inputs of AND gate 212 are $\phi5^*$ and $\phi6^*$, the inputs of AND gate 214 are $\phi7^*$ and $\phi8^*$, the inputs of AND gate 216 are $\phi9^*$ and $\phi10^*$, and the inputs of AND gate 218 are $\phi11^*$ and $\phi12^*$. The inputs to OR gate 220 are the outputs of AND gates 196, 198 and 200, the inputs to OR gate 222 are the outputs of AND gates 202, 204 and 206, the inputs to OR gate 224 are the outputs of AND gates 208, 210 and 212, and the inputs to OR gate 226 are the outputs of AND gates 214, 216 and 218. The inputs to OR gate 228 are the outputs of OR gates 220 and 222, the inputs to OR gate 230 are the outputs of OR gates 224 and 226, and finally the inputs to OR gate 232 are the outputs of OR gates 228 and 230. The output of OR gate 232 is the output clock $f_1$. With the combinational logic of FIG. 9e output clock $f_1$ is 12 times the input frequency. Those skilled in the art will recognize that other combinational logic may be implemented to accomplish the following function as embodied in FIG. 9e:

$$\phi_{OUT} = (\phi1 \times \phi2) + (\phi3 \times \phi4) + (\phi5 \times \phi6) + (\phi7 \times \phi8) + \quad \text{(Equation 11)}$$
$$(\phi9 \times \phi10) + (\phi11 \times \phi12) + (\phi1^* \times \phi2^*) + (\phi3^* \times \phi4^*) +$$
$$(\phi5^* \times \phi6^*) + (\phi7^* \times \phi8^*) + (\phi9^* \times \phi10^*) + (\phi11^* \times \phi12^*)$$

Figure 10A:
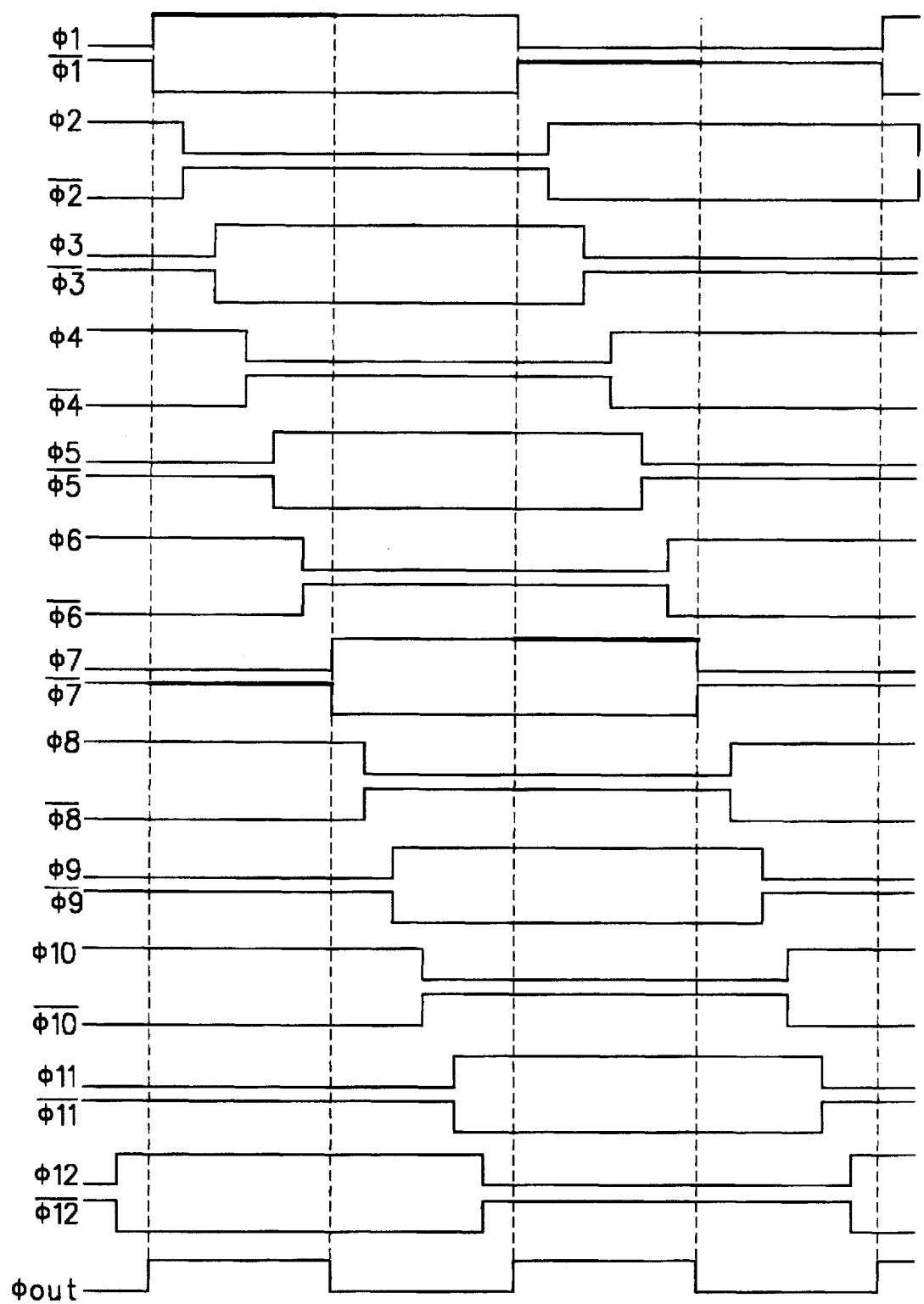
FIGS. 10a–10d are timing diagrams illustrating the operation of a phase locked loop of the embodiments of the present invention as shown in FIGS. 8 and 9a–c.
Figure 10B:
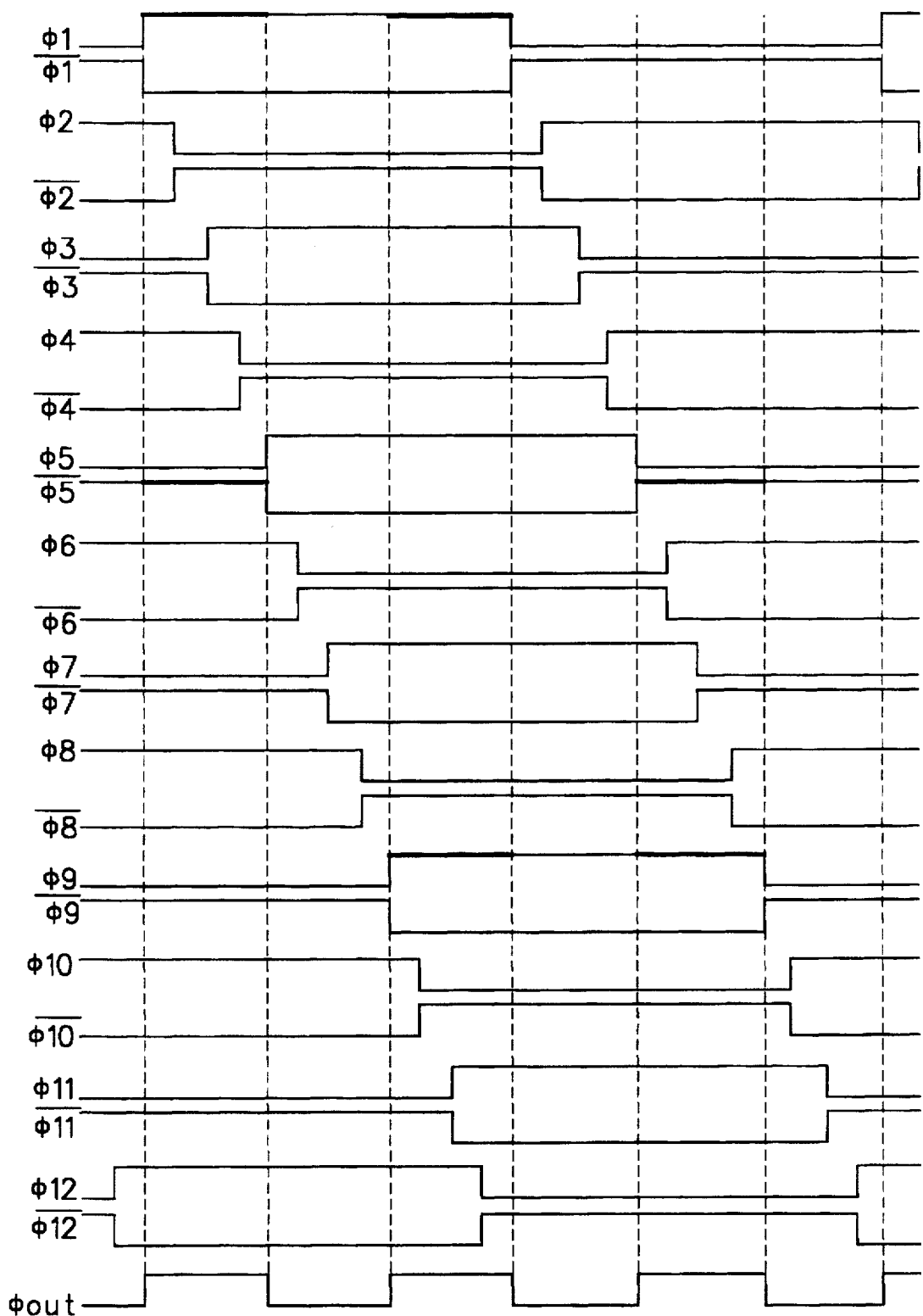
Figure 10C:
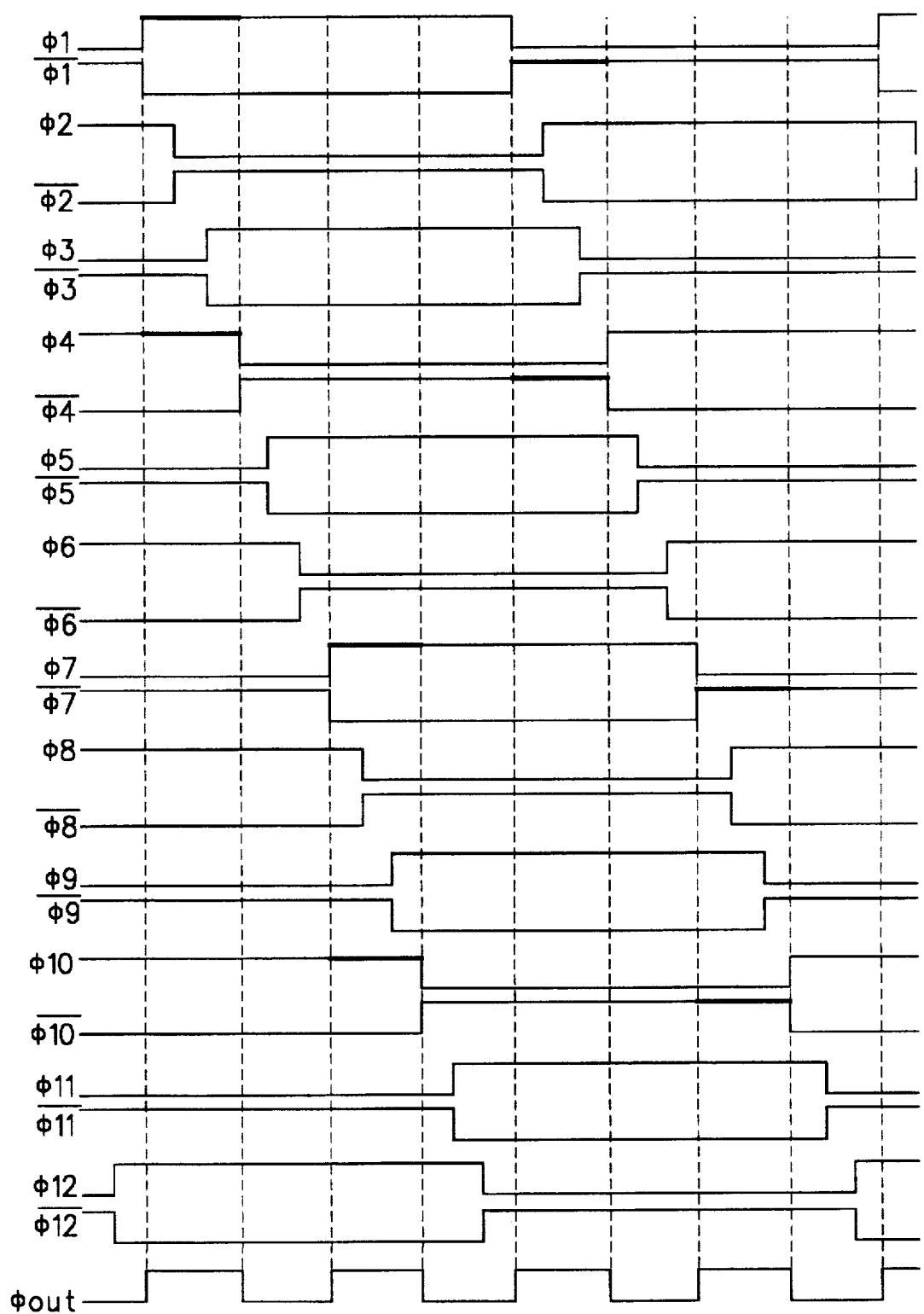

FIGS. 10a–10c are timing diagrams that illustrate the operation of a phase locked loop of the embodiments of the present invention as shown in FIGS. 8 and 9a–c. FIG. 10a shows all of the output phases (i.e., $\phi1$–$\phi12$) and $\phi OUT$ as a result of multiplying the input frequency (same as $\phi1$) by 2 times in accordance with Equation 7. The darkened portions of the various wave forms are shown to illustrate the portions of those wave forms that are ANDED together to create the output wave form of the output clock at frequency $f_1$.

Likewise, FIG. 10b shows all of the output phases and $\phi OUT$ as a result of multiplying the input frequency by 3 times in accordance with Equation 8, and FIG. 10c shows all of the output phases and $\phi OUT$ as a result of multiplying the input frequency by 4 times in accordance with Equation 9. Again, the darkened portions of the various wave forms are shown to illustrate the portions of those wave forms that are ANDED together to create the output wave form of the output clock at frequency $f_1$.

It is further possible to provide a combinational logic portion that produces an output clock signal that has a non-uniform duty cycle. A uniform duty cycle is one that has equal ON and OFF (e.g., logical high and low) cycles. In other words, for a clock signal having a uniform duty cycle the signal will be ON for about 50% and OFF for about 50% of the time during a cycle (i.e., 50/50). A non-uniform duty cycle, to the contrary, is one that is not 50/50, such as, e.g., 25/75, and 33/66 (or 75/25, and 66/33) with respect to the ON/OFF ratio. With the $\phi1$–$\phi12$ and $\phi1^*$–$\phi12^*$ (or N numbers of) phase signals several unique non-uniform duty cycle signals can be generated. By way of example, a 25/75 signal with a frequency equal to the input clock can be generated with a combinational logic portion that produces a $\phi OUT = (\phi1 \times \phi7^*)$. Similarly, a 25/75 signal with a frequency equal to twice the input clock can be generated with a combinational logic portion that produces a $\phi OUT = (\phi1 \times \phi4) + (\phi1^* \times \phi4^*)$.

Figure 10D:
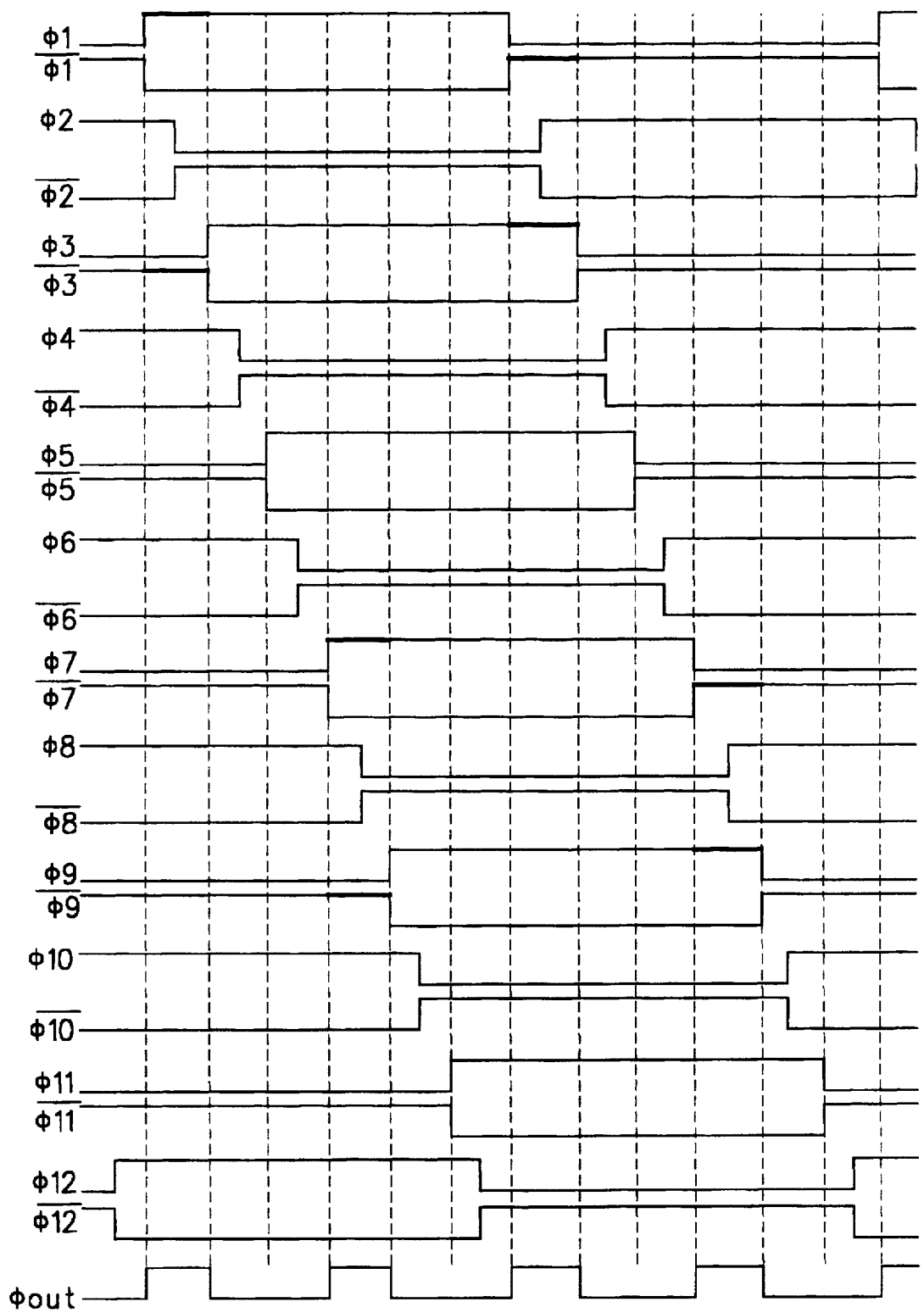

By way of example, FIG. 10d is timing diagram that illustrates the operation of a phase locked loop, in accordance with one embodiment of the present invention, that produces a 33/66 signal with a frequency equal to four times the input clock. As shown, the combinational logic within the VCO produces $\phi OUT=(\phi1\times\phi3^*)+(\phi7\times\phi9^*)+(\phi1^*\times\phi3)+(\phi7^*\times\phi9)$.

Non-uniform duty cycle clock signals, such as those above, can be used, for example, in applications where additional time is required to complete a function, or to allow a circuit or component to settle following a transition or other operation. Such clock signals can be employed, for example, in memory circuits, such as one that includes a random access memory (RAM), to allow for settling and/or charging times within the RAM and supporting I/O circuits.

As mentioned above, in accordance with the present invention, the multistage oscillator portion can have more than 12 stages (i.e., n-stages). By way of example, a 24-stage oscillator portion would be able to support combinational logic to produce output frequencies that are 1, 2, 3, 4, 6, 8, 12 and 24 times the input frequency without requiring switching hardware or causing the PLL to momentarily go out of lock. For applications requiring even more output frequencies, the multistage oscillator portion can include 30, 32, 48, 60, 64, or greater number of stages. It is, however, recognized that there are practical limitations, such as space and power limitations, that will tend to limit the number of stages for a given application.

With the proper selection of components of the multistage oscillator and combinational logic portions, the VCO can be configured to supply a plurality of output clocks. For example, the twelve-stage oscillator and combinational logic portions in FIGS. 8, and 9a–e, respectively, can be combined within a single VCO to output six different output clocks (i.e., $f_1$, $2\times f_1$, $3\times f_1$, $4\times f_1$, $6\times f_1$, and $12\times f_1$) at the same time. However, with this many output clocks, or even more, the VCO tends to require more power and as a result generates more thermal energy. Additionally, as with the four-stage oscillator, a twelve-stage oscillator and combinational logic, as discussed above, can also be configured with multiplexers so as to reconfigure the number of oscillators and thereby produce an output clock that is not based on an integer multiple of 12, e.g., $10\times f_1$. However, as with the four-stage oscillator, configuring between a twelve-stage and a ten-stage oscillator, for example, will cause the PLL to momentarily lose lock.

Figure 11:
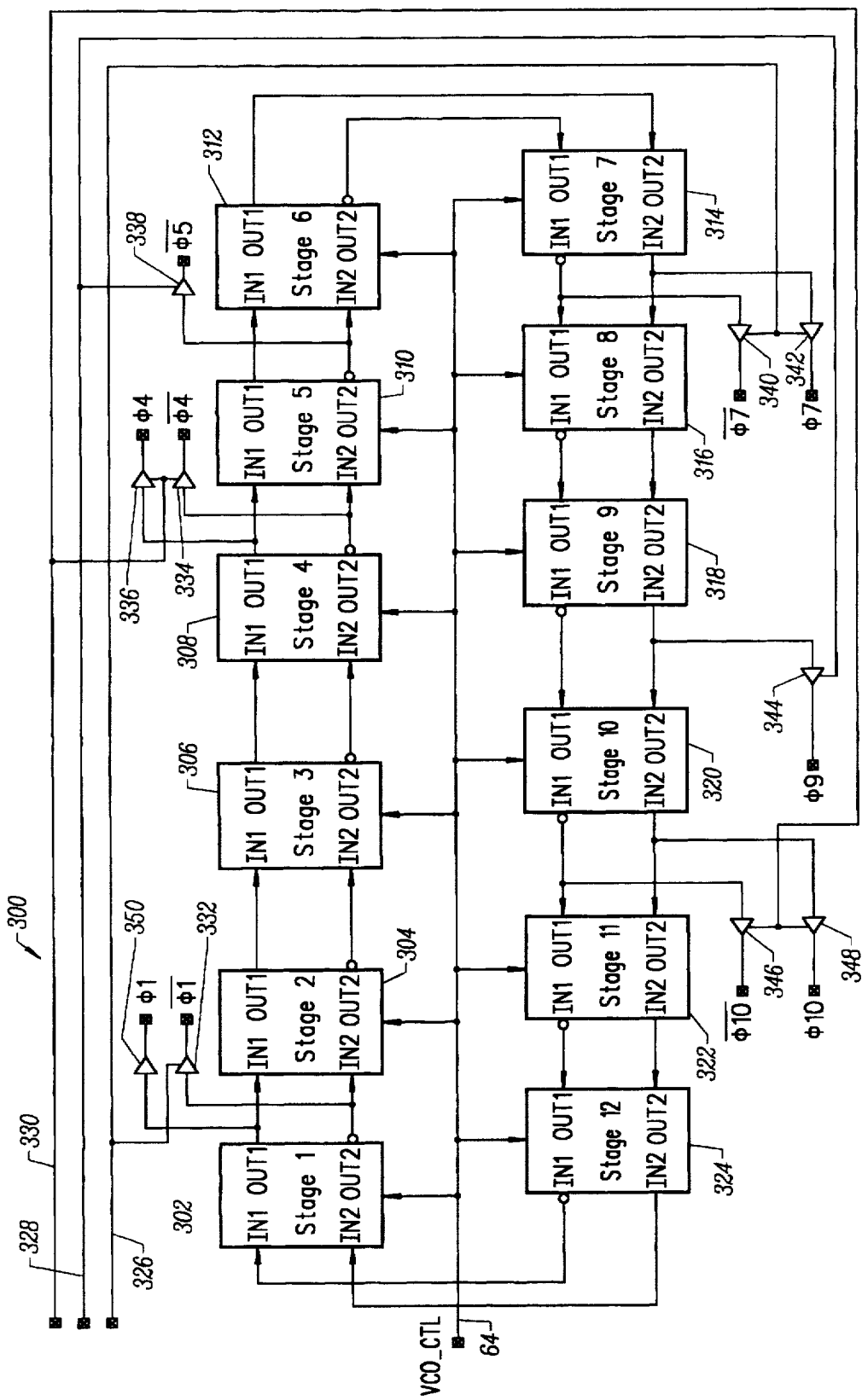
FIG. 11 is a schematic of a reduced-power multi-stage (twelve-stage) oscillator portion of a VCO in accordance with another embodiment of the present invention.

With this in mind, FIG. 11 is a schematic of a reduced-power multi-stage (twelve-stage) oscillator portion of a VCO in accordance with another embodiment of the present invention. The reduced-power multi-stage oscillator portion 300 in FIG. 11 includes twelve stages 302, 304, 306, 308, 310, 312, 314, 316, 318, 320, 322, and 324 which are coupled together as are the twelve stages in FIG. 8, above. Oscillator portion 300 further includes three enable lines 326, 328 and 330 which are each coupled to one or more buffers so as to enable and disable each buffer from outputting an output phase. By setting enable lines 326, 328 and 330 to either logic high or logic low states, the number of phase signals supplied to the combinational logic portion within the VCO can be controlled, thereby reducing the number of operating circuits and the power required.

Enable lines 326, 328 and 330 are encoded with logic signals that establish the output phases that are supplied to the combinational logic. By setting the logic state of each of these lines, the multiplication desired can be accomplished without having the combinational logic receiving phase outputs that are not required for the selected multiplication. As will discussed in greater detail below, the logic encoding is as follows:

lines 326, 328, 330=0, 0, 0 (respectively), then times 1 multiplication is selected;

lines 326, 328, 330=0, 0, 1 (respectively), then times 2 multiplication is selected;

lines 326, 328, 330=0, 1, 0 (respectively), then times 3 multiplication is selected;

lines 326, 328, 330=1, 0, 1 (respectively), then times 4 multiplication is selected.

As shown, enable line 326 is coupled to buffers 332, 340 and 342. Buffer 332 is coupled to receive the output OUT2 (i.e., $\phi1^*$) from stage 302 and outputs $\phi1^*$ when enable line 326 is logic high (e.g., 1). Buffers 340 and 342 are coupled to receive the outputs OUT2 and OUT1 (i.e., $\phi7^*$ and $\phi7$), respectively, from stage 314, and output $\phi7^*$ and $\phi7$, respectively, when enable line 326 is logic high (e.g., 1).

Enable line 328 is coupled to buffers 338 and 344. Buffer 338 is coupled to receive the output OUT2 (i.e., $\phi5^*$) from stage 310 and outputs $\phi5^*$ when enable line 328 is logic high (e.g., 1). Buffer 344 is coupled to receive the output OUT1 (i.e., $\phi9$) from stage 318, and output $\phi9$ when enable line 326 is logic high (e.g., 1).

Similarly, enable line 330 is coupled to buffers 334, 336, 346 and 348. Buffers 334 and 336 are coupled to receive the outputs OUT2 and OUT1 (i.e., $\phi4^*$ and $\phi4$), respectively, from stage 308, and output $\phi4^*$ and $\phi4$, respectively, when enable line 330 is logic high (e.g., 1). Buffers 346 and 348 are coupled to receive the outputs OUT2 and OUT1 (i.e., $\phi10^*$ and $\phi10$), respectively, from stage 320, and output $\phi10^*$ and $\phi10$, respectively, when enable line 330 is logic high (e.g., 1).

Figure 12:
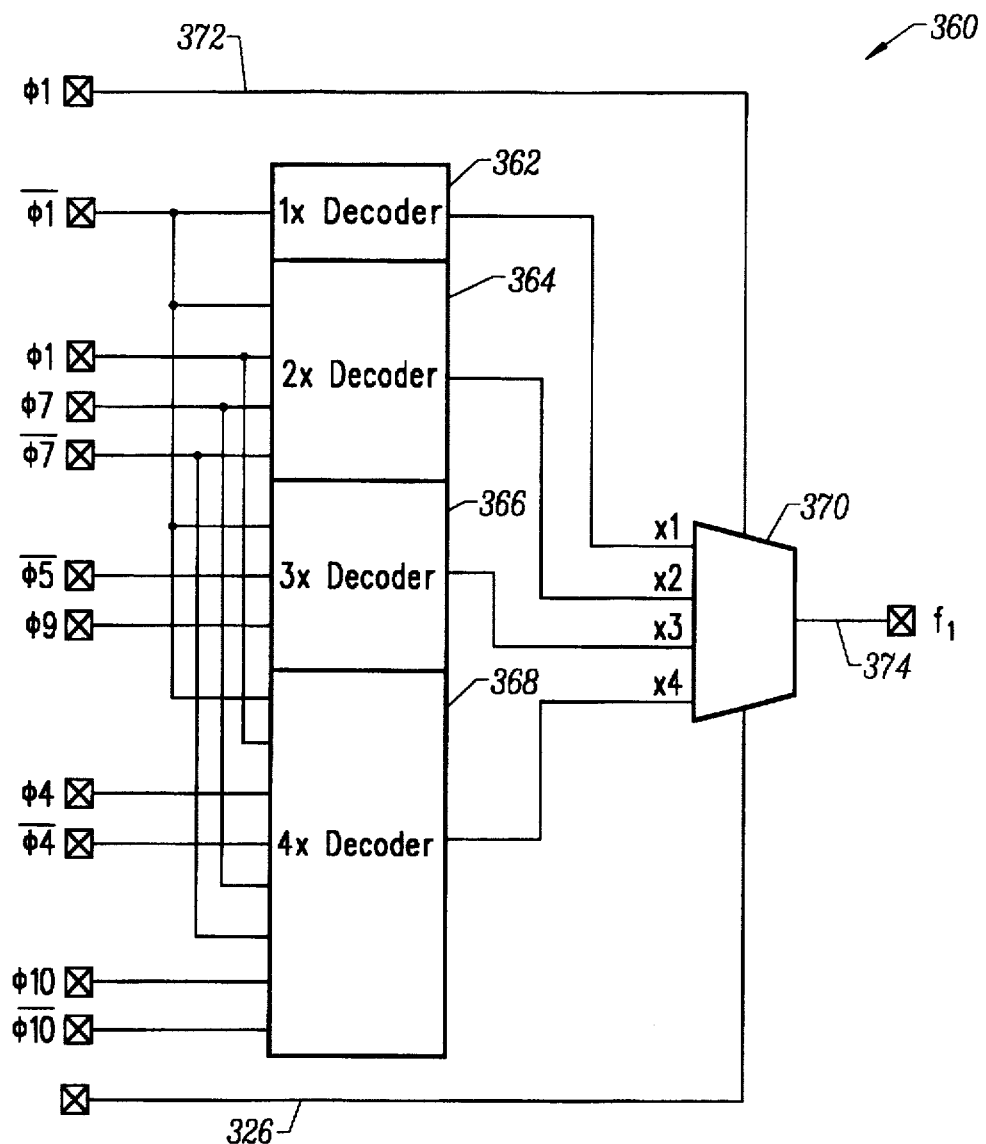
FIG. 12 is a schematic of a combination logic portion of a VCO, in accordance with an embodiment of the present invention, that can be used with the reduced-power multi-stage (twelve-stage) oscillator portion of FIG. 11.

FIG. 12 is a schematic of a combinational logic portion 360 of a VCO, in accordance with an embodiment of the present invention, that can be used with the reduced-power multi-stage (12-stage) oscillator portion of FIG. 11. As shown, FIG. 12 illustrates combinational logic in the form of a block diagram having a plurality of decoder blocks. The block diagrams can, for example, include combinational logic as discussed above and shown in FIGS. 6a–b and 9a–e, or other like logic circuits and/or processes.

As shown, FIG. 12 combinational logic portion 360 includes a "1×" decoder 362, a "2×" decoder 364, a "3×" decoder 366, a "4×" decoder 368, and a multiplexer 370. The 1× decoder 362 is arranged to receive the $\phi1$ output from buffer 350 (in FIG. 11), and to output an $f_1=\phi1$ clock to multiplexer 370. The 2× decoder 364 is arranged to receive the $\phi1$ output from buffer 350, the $\phi1^*$ output from buffer 332, the $\phi7$ output from buffer 342, and the $\phi7^*$ output from buffer 340, and to output an $f_1=(\phi1\times\phi7^*)+(\phi1^*\times\phi7)$ clock (i.e., 2 times the input frequency) to multiplexer 370. The 3× decoder 366 is arranged to receive the $\phi1$ output from buffer 350, the $\phi5^*$ output from buffer 338, and the $\phi9$ output from buffer 344, and to output an $f_1=(\phi1\times\phi5^*)+(\phi1\times\phi9)+(\phi5^*\times\phi9)$ clock (i.e., 3 times the input frequency) to multiplexer 370. And, the 4× decoder 368 is arranged to receive the $\phi1$ output from buffer 350, the $\phi1^*$ output from buffer 332, the $\phi4$ output from buffer 336, the $\phi4^*$ output from buffer 334, the $\phi10$ output from buffer 348, and the $\phi10^*$ output from buffer 346, and to output an $f_1=\phi1\times\phi4)+(\phi7\times\phi10)+(\phi1^*\times\phi4^*)+(\phi7^*\times\phi10^*)$ clock (i.e., 4 times the input frequency) to multiplexer 370.

The output of multiplexer 370 is controlled, or selected, by two control lines, enable line 326 (from FIG. 11) and enable line 372 such that when:

lines 372, 326=0, 0 (respectively), then the output from the 1× decoder 362 is output on line 374;

lines 372, 326=0, 1 (respectively), then the output from the 2× decoder 364 is output on line 374;

lines 372, 326=1, 0 (respectively), then the output from the 3× decoder 366 is output on line 374; and lines 372, 326=1, 1 (respectively), then the output from the 4× decoder 368 is output on line 374.

Figure 13:
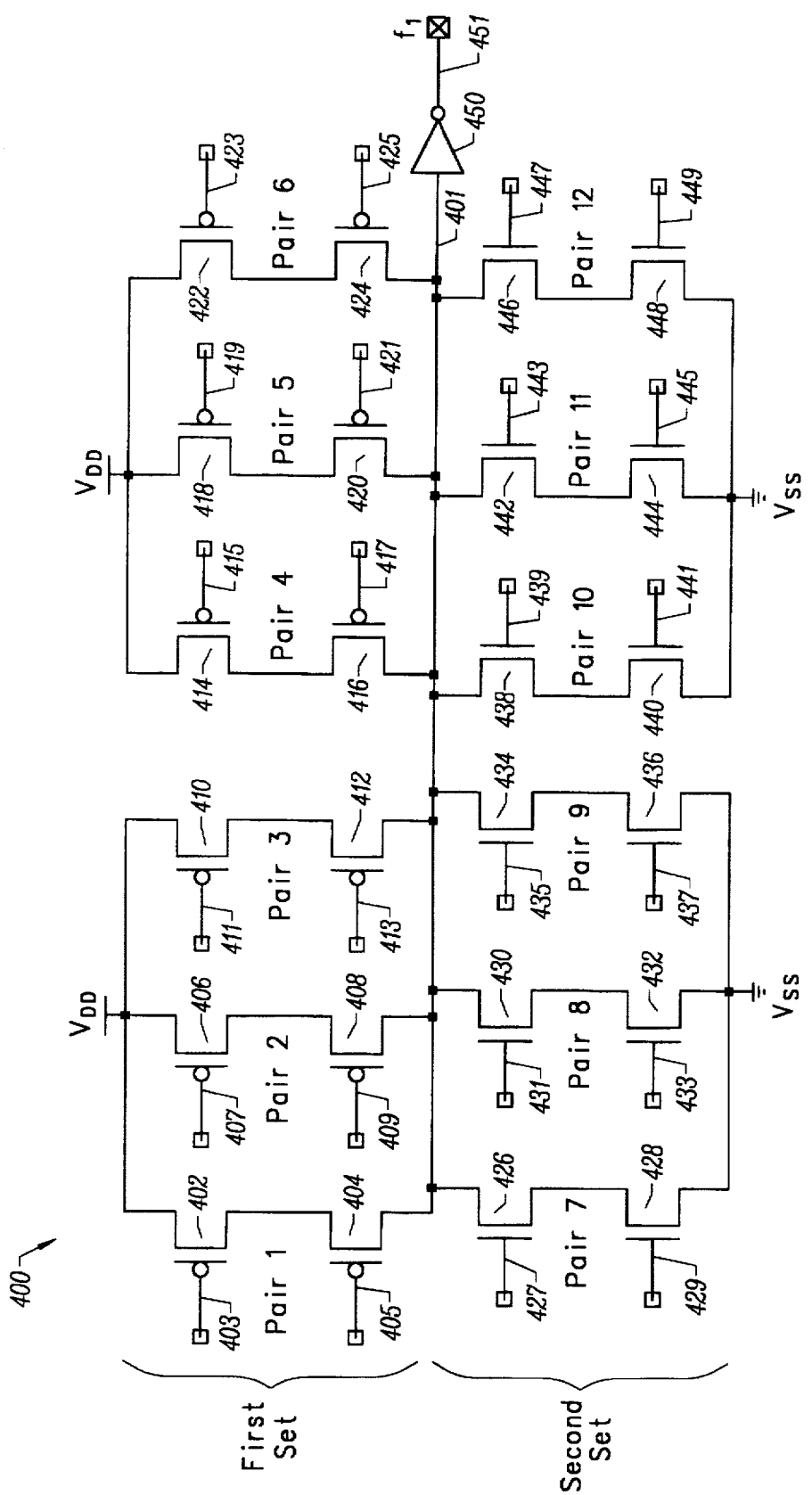
FIG. 13 is a schematic of a combinational logic in the form of a decoder that is suitable for use in a VCO, in accordance with one embodiment of the present invention.

FIG. 13 is as schematic of one embodiment of a combinational logic in the form of a decoder 400 suitable for use in a VCO in accordance with one embodiment of the present invention. Decoder 400, as depicted can be configured to decode 1, 2, 3, 4, and 6 times output clocks using phase signals selected from the group φ1–φ12, and φ1*–φ12* e.g., produced by a twelve or greater stage VCO). For example, decoder 400 could be used as "1×" decoder 362, a "2×" decoder 364, a "3×" decoder 366, or as a "4×" decoder 368 as shown in FIG. 12. By decoding in the manner depicted by decoder 400, regardless as to the output clock desired, the additional phase delay introduced by decoder 400 itself will always be about the same due to the component and routing symmetry embodied therein. Furthermore, decoder 400 can be increased to allow for the inputting of additional phase inputs and thus can be used to implement the additional combinational logic required to produce additional output clocks.

Decoder 400 basically includes two sets of transistors, wherein the first set of transistors are coupled between a voltage $V_{DD}$ and a common node 401, and the second set of transistors are coupled between a voltage $V_{SS}$ (e.g., ground) and common node 401. Depending upon the desired output clock, specific phase signals taken from the outputs (e.g., OUT1 and OUT2) of the multiple-stage oscillator are provided to the inverting gates of one or more transistors in the first set of transistors, and/or to the non-inverting gates of one or more transistors in the second set of transistors in accordance with the combinational logic scheme associated with the desired output clock (e.g., see equations above).

As shown, the first set of transistors includes six pairs of ANDING* transistors, namely transistors (pair 1) 402 and 404, (pair 2) transistors 406 and 408, (pair 3) 410 and 412, (pair 4) 414 and 416, (pair 5) 418 and 420, and (pair 6) 422 and 424.. The transistors, within each of these pairs of ANDING* transistors, are coupled in series such that when both of the transistors are "on" then $V_{DD}$ is applied to common node 401. In other words, for any given pair in the first set of transistors, when the phase signal inputs to the inverting gates of the transistors are 0, then the transistors will be on and common node 401 will be driven to a 1.

Similarly, the second set of transistors includes six pairs of ANDING transistors, namely transistors (pair 7) 426 and 428, (pair 8) transistors 430 and 432, (pair 9) 434 and 436, (pair 10) 438 and 440, (pair 11) 442 and 444, and (pair 12) 446 and 448. The transistors, within each of these pairs of ANDING transistors, are coupled in series such that when both of the transistors are "on" then common node 401 is connected to $V_{SS}$. In other words, for any given pair in the second set of transistors, when the phase signal inputs to the inverting gates of the transistors are 1, then the transistors will be on and common node 401 will be driven to a 0. Common node 401 is further coupled to an invertor 450 that completes the decoding process and as such outputs the decoded output clock signal onto.

By way of example, a six times (6f$_1$) output clock can be generated with decoder 400 by configuring the first and second sets of transistors to decode:

φOUT=(φ1×φ3*)+(φ5×φ7*)+(φ9×φ11*)+(φ1*×φ3)+(φ5*×φ7)+(φ9*× φ11)  (Equation 12)

Thus, for example, Table 1 (below) lists the input nodes (i.e., transistor gates) for each of the phase signals input to decoder 400 in accordance with Equation 12 above:

TABLE 1

| Phase Signal | Decoder Input Line |
|---|---|
| φ1 | 427, 423 |
| φ1* | 411, 439 |
| φ2 | (not used) |
| φ2* | (not used) |
| φ3 | 441, 415 |
| φ3* | 429, 403 |
| φ4 | (not used) |
| φ4* | (not used) |
| φ5 | 405, 431 |
| φ5* | 417, 443 |
| φ6 | (not used) |
| φ6* | (not used) |
| φ7 | 445,419 |
| φ7* | 433, 407 |
| φ8 | (not used) |
| φ8* | (not used) |
| φ9 | 409, 435 |
| φ9* | 421, 447 |
| φ10 | (not used) |
| φ10* | (not used) |
| φ11 | 449, 425 |
| φ11* | 437, 413 |
| φ12 | (not used) |
| φ12* | (not used) |

Figure 14:
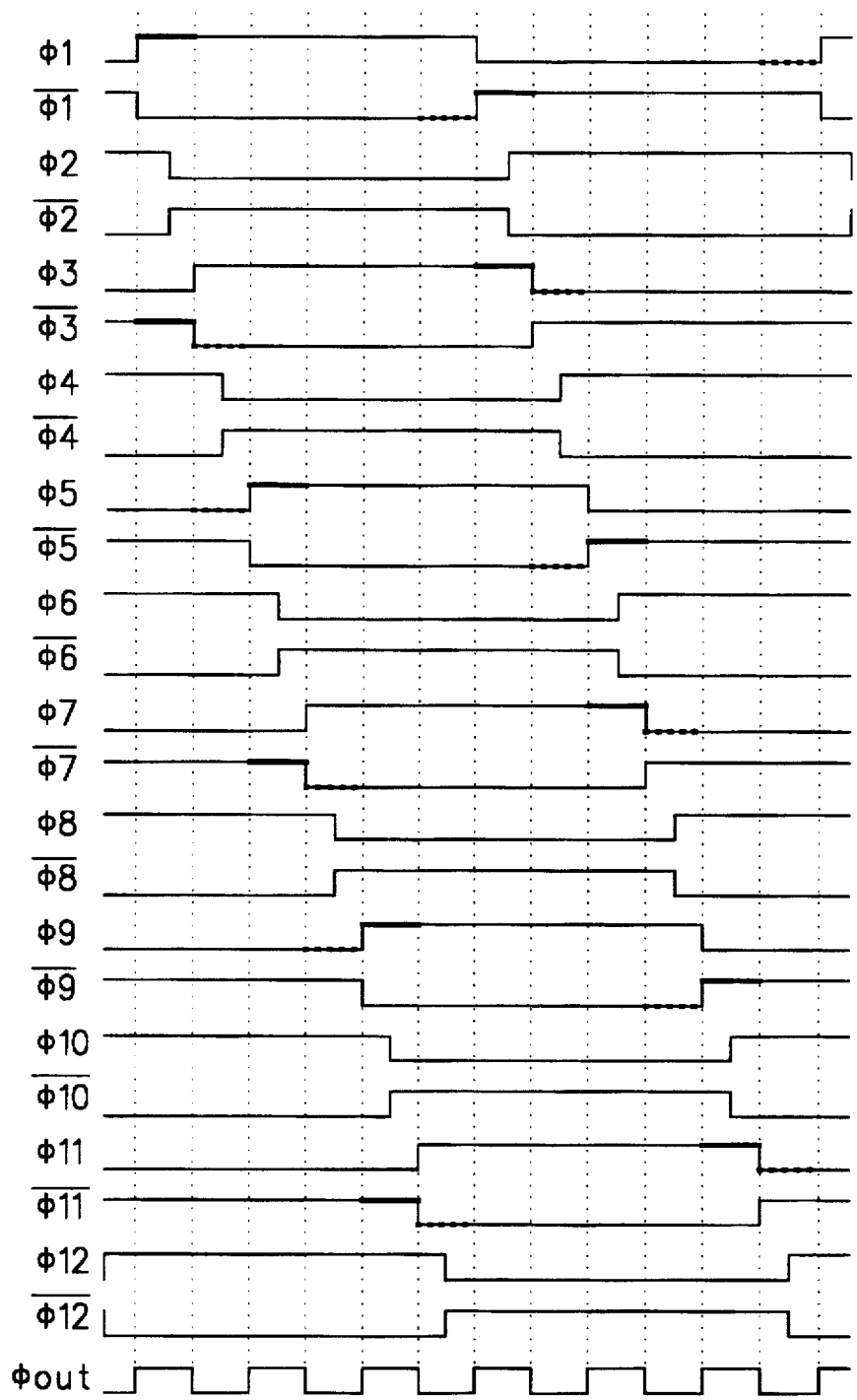
FIG. 14 is a timing diagram that illustrates the combinational logic performed by the decoder in FIG. 13 when configured in accordance with Table 1 of the specification.

FIG. 14 is a timing diagram that illustrates the combinational logic performed by the decoder in FIG. 13 when configured in accordance with Table 1. As shown in FIG. 14, the portions of the phase signals being "ANDED*" with the second set of transistors are highlighted with solid darkened lines, and the portions of the phase signals being "ANDED" with the first set of transistors are highlighted with dashed darkened lines.

Notice that all of the transistors in decoder 400 are being used in the six times example above. However, this is not always the case, there are configurations, such as 1×, 2×, 3×, and 4× decoders, wherein some of the transistors will not be used. In such a decoder, any unused transistors will need to be configured to an "off" state. Thus, the lines coupled to the inverting gates in the unused transistors in the first set of transistors will need to be coupled to $V_{DD}$, and the lines coupled to the non-inverting gates in the unused transistors in the second set of transistors will need to be coupled to $V_{SS}$.

Figure 15A:
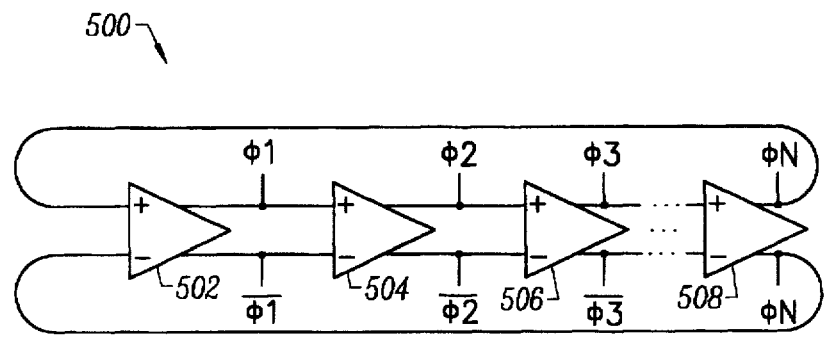
FIG. 15a is a block diagram that illustrates a multi-stage oscillator, in accordance with one embodiment of the present invention, having differential amplifiers for stages.
Figure 15B:
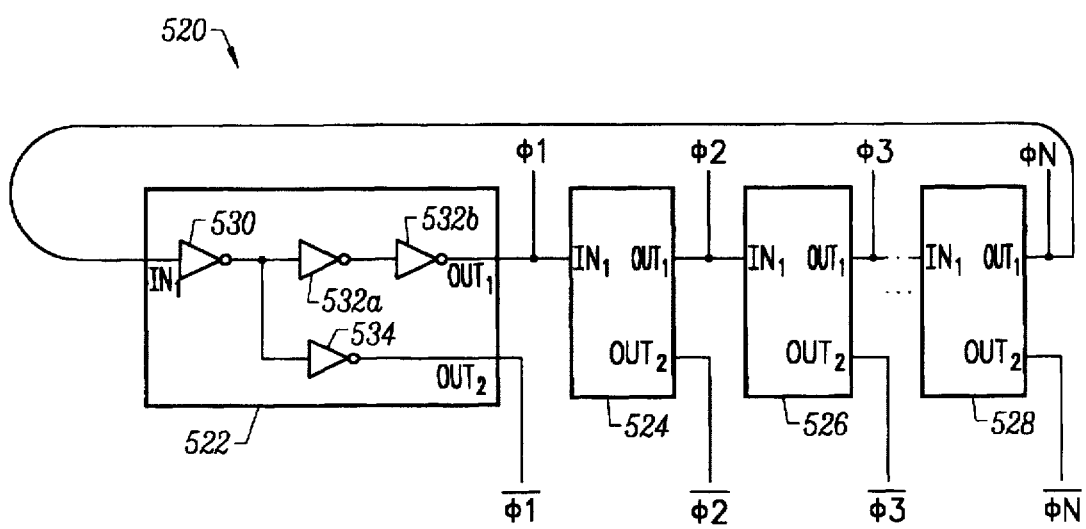
FIG. 15b is a block diagram that illustrates a multi-stage oscillator, in accordance with one embodiment of the present invention, having one or more invertors for stages.

FIGS. 15a and 15b are block diagrams that illustrate additional embodiments of a multi-stage oscillator in accordance with the present invention. FIG. 15a illustrates a multi-stage oscillator 500, having 1 through "n" stages, wherein each stage is represented by a differential amplifier. Each differential amplifier includes a positive and a negative input and a positive and a negative output. As such, stage 1 includes differential amplifier 502, stage 2 includes differential amplifier 504, stage includes differential amplifier 506, and stage n includes differential amplifier 508. As with the latch based oscillators above, the phase signals can be taken from the outputs of each differential amplifier. However, the phase signals from a differential amplifier based oscillator will be analog signals and as such will need to be converted to a digital signal before being supplied to the combinational (i.e., decoding) logic. One way to convert an analog signal to a digital signal is to pass the analog through a Schmitt-triggered buffer or other like circuit. Further, unlike some of the latch based oscillators there is no need to cross the feedback because the positive and negative outputs from a given stage are the mirror-image of one another. By using differential amplifiers to create a multi-stage oscillator higher input and output clock frequencies, e.g., in excess of 100 MHz, can be supported because of reduced voltage swings provided by the differential amplifiers.

FIG. 15b illustrates a multi-stage oscillator 520, having 1 through "n" stages, wherein each stage is represented by an invertor block. Each invertor block has one input (IN1) and two outputs (OUT1 and OUT2). OUT1 provides a φ signal and OUT2 provides a φ* signal for the associated stage. As shown, stage 1 includes invertor block 522, stage 2 includes invertor block 524, stage 3 includes invertor block 526, and stage n includes invertor block 528. Invertor block 522 is shown as having four invertors, 530, 532a, 532b, and 524. Invertor 530 has its input coupled to IN1 and its output coupled to the inputs of invertors 532a and 534. Invertor 534 outputs a φ* signal onto OUT2, while invertor 532a has its output coupled to the input of invertor 532b. Invertor 532b outputs a 4 signal onto OUT1. To function properly, i.e., produced synchronized φ and φ* signals, the combined signal propagation delays through invertors 532a and 532b needs to be equal to the delay of invertor 534.

Some of the advantages and possible applications for the PLL and VCO's presented above in accordance with the several embodiments of the present invention will now be discussed. Those skilled in the art will recognize that there are other possible applications that can benefit from multiple clock signals, or from specially shaped clock signals, such as phase shifted clock signals as discussed above and clock signals with special duty cycles as described below, or other like signals.

An additional benefit and use for the PLLs (and VCOs) presented in the several embodiments of the present invention is that a plurality of clock signals can be generated simultaneously with a single PLL. Thus, applications that include two or more of components that operate at different frequencies can be connected to a single PLL that provides synchronized clock signals suitable for operating each of the components.

Furthermore, the PLLs (and VCOs) presented in the several embodiments of the present invention can support circuits, such as microprocessors and the like that may adjust or modify the operating clock frequency while operating. By way of example, this type of operation is described in U.S. Pat. No. 4,893,271, issued Jan. 9, 1990, and which is incorporated herein by reference.

While this invention has been described in terms of several preferred embodiments, there are alterations, permutations, and equivalents which fall within the scope of this invention as noted above. It is therefore intended that the following appended claims be interpreted as including all such alterations, permutations, and equivalents as fall within the true spirit and scope of the present invention.

What is claimed is:

1. A phase locked loop (PLL) comprising:
 a comparator responsive to an input clock and a VCO clock, said input clock having an input clock frequency and said VCO clock having a VCO clock frequency, said comparator being operative to compare a signal derived from said input clock frequency and a signal derived from said VCO clock frequency and to develop a comparator output signal in response thereto;
 a VCO controller responsive to said comparator output signal and operative to produce a VCO control signal; and
 a voltage controlled oscillator (VCO) having:

an oscillator having a plurality of stages, wherein an "n" number of said plurality of stages are configured to oscillate at a first frequency during a steady state condition, wherein said "n" number of said plurality of stages generates a plurality of phase signals at said first frequency in response to said VCO control signal;
 a decoding logic being coupled to said oscillator and being responsive to at least two of said plurality of phase signals, said decoding logic being configured to generate at least one clock signal at a second frequency that is a "y" multiple of said first frequency, wherein "n" divided by "y" is equal to a positive integer.

2. A phase locked loop as recited in claim 1 wherein said comparator output signal is of a first type when said input clock frequency is greater than said VCO clock frequency, and is of a second type when said input clock frequency is less than said VCO clock frequency.

3. A phase locked loop as recited in claim 2 wherein said VCO controller comprises a loop filter controlled by said comparator output signal.

4. A phase locked loop as recited in claim 1 wherein said plurality of stages is a plurality of latches, where an input of each latch except a first latch is coupled to an output of a preceding latch, and where an input of said first latch is coupled to an output of a last latch, where each of said latches provides a delay having a period controlled by said VCO control signal.

5. A phase locked loop as recited in claim 4 wherein said plurality of latches each include a pair of inputs and a corresponding pair of outputs such that a first output is a phase-delayed version of said first input and such that a second output is a phase-delayed version of said second input and which is a complement of said first output, wherein for each latch except said first latch a first input is coupled to a first output of a preceding latch and a second input is coupled to a second output of said preceding latch.

6. A phase locked loop as recited in claim 5 wherein there are an even number of latches, and wherein a first output of said last latch is coupled to a second input of said first latch, and wherein a second output of said last latch is coupled to a first input of said first latch.

7. A phase locked loop as recited in claim 5 wherein there are an odd number of latches, and wherein a first output of said last latch is coupled to a first input of said first latch, and wherein a second output of said last latch is coupled to a second input of said first latch.

8. A phase locked loop as recited in claim 5 wherein said plurality of phase signals include a plurality of phase signals taken from said first outputs of said latches, and a plurality of inverted phase signals taken from said second outputs of said latches.

9. A phase locked loop as recited in claim 1 wherein said decoding logic is operative to produce multiple clock signals simultaneously.

10. A phase locked loop as recited in claim 9 wherein said multiple clock signals are at multiple frequencies.

11. A phase locked loop as recited in claim 10 wherein said multiple clock signals are at multiple phases.

12. A phase locked loop as recited in claim 1 further comprising a feedback divider coupling said VCO clock to said comparator such that said VCO clock frequency is a multiple of said input clock frequency as determined by a divisor provided by said feedback divider.

13. The phase locked loop as recited in claim 1 wherein said oscillator is reconfigurable in response to a selection control signal such that said "n" number of said plurality of stages is established thereby.

14. The phase locked loop as recited in claim 1 wherein each of said plurality of stages is selected from the group of consisting of a latch, a differential amplifier, and one or more invertors, and wherein said plurality of stages are configured in a delay chain.

15. The phase locked loop as recited in claim 1 wherein said decoding logic includes one or more selected from the group consisting of an AND gate, an OR gate, an invertor, a multiplexer, and one or more transistors, that are responsive to at least one of said plurality of phase signals.

16. The phase locked loop as recited in claim 1 wherein said clock signal has a non-uniform duty-cycle.

17. A voltage controlled oscillator (VCO) circuit, comprising:
  an oscillator having a plurality of stages, wherein an "n" number of said plurality of stages are configured to oscillate at a first frequency during a steady state condition, wherein said "n" number of said plurality of stages generates a plurality of phase signals at said first frequency in response to a control signal;
  a decoding logic being coupled to said oscillator and being responsive to at least two of said plurality of phase signals, said decoding logic being configured to generate at least one clock signal at a second frequency that is a "y" multiple of said first frequency, wherein "n" divided by "y" is equal to a positive integer.

18. The voltage controlled oscillator as recited in claim 17 wherein two or more of said plurality of phase signals are out of phase from one another.

19. The voltage controlled oscillator as recited in claim 18 wherein two or more of said plurality of phase signals are complements of one another.

20. The voltage controlled oscillator as recited in claim 17 wherein said oscillator is reconfigurable in responsive to a selection control signal such that said "n" number of said plurality of stages is established thereby.

21. The voltage controlled oscillator as recited in claim 17 wherein each of said plurality of stages is selected from the group of consisting of a latch, a differential amplifier, and one or more invertors, and wherein said plurality of stages are configured in a delay chain.

22. The voltage controlled oscillator as recited in claim 17 wherein said decoding logic includes one or more selected from the group consisting of an AND gate, an OR gate, an invertor, a multiplexer, and one or more transistors, that are responsive to at least one of said plurality of phase signals.

23. The voltage controlled oscillator as recited in claim 17 wherein said decoding logic simultaneously generates two or more clock signals.

24. The voltage controlled oscillator as recited in claim 17 wherein said clock signal has a non-uniform duty-cycle.

25. A voltage controlled oscillator as recited in claim 17 wherein said decoding logic performs the following function when said "n" number of said plurality of stages is an even number:

$$\phi_{OUT} = \sum_{i=1}^{n/2} [(\phi_{2i-1} \times \phi_{2i}) + (\phi^*_{2i-1} \times \phi^*_{2i})]$$

26. A voltage controlled oscillator as recited in claim 17 wherein said decoding logic performs the following function when said "n" number of said plurality of stages is an odd number:

$$\phi_{OUT} = (\phi_1 \times \phi_n) + \sum_{i=1}^{n-1} (\phi_i \times \phi_{i+1}).$$

27. A method for generating one or more clock signals, the method comprising:
  providing a plurality of stages, wherein an "n" number of said plurality of stages are coupled together to form a delay chain;
  configuring said delay chain to oscillate at a first frequency during a steady state condition;
  applying a control signal to said delay chain, said control signal establishing a delay time in each of said plurality of stages within said delay chain;
  generating a plurality of phase signals at said first frequency with said delay chain in response to said control signal;
  decoding at least two of said plurality of phase signals and generating at least one clock signal at a second frequency that is a "y" multiple of said first frequency, wherein "n" divided by "y" is equal to a positive integer.

28. The method as recited in claim 27 wherein two or more of said plurality of phase signals are out of phase from one another.

29. The method as recited in claim 27 wherein two or more of said plurality of phase signals are complements of one another.

30. The method as recited in claim 27 wherein said delay chain is established in responsive to a selection control signal such that said "n" number of said plurality of stages in said delay chain is established thereby.

31. The method as recited in claim 27 further comprising simultaneously generating two or more clock signals.

32. The method as recited in claim 27 wherein said clock signal has a non-uniform duty-cycle.

* * * * *